United States Patent [19]

Nishino et al.

[11] Patent Number: 5,057,485

[45] Date of Patent: Oct. 15, 1991

[54] LIGHT DETECTING SUPERCONDUCTING JOSEPHSON DEVICE

[75] Inventors: Toshikazu Nishino, Kawasaki; Ushio Kawabe, Tokyo; Mutsuko Hatano, Kodaira, all of Japan

[73] Assignee: Hitachi, Ltd., Japan

[21] Appl. No.: 192,545

[22] Filed: May 11, 1988

[30] Foreign Application Priority Data

| May 15, 1987 | [JP] | Japan | 62-116809 |
| May 15, 1987 | [JP] | Japan | 62-116810 |
| May 25, 1987 | [JP] | Japan | 62-125922 |
| Jun. 15, 1987 | [JP] | Japan | 62-147045 |
| Jun. 17, 1987 | [JP] | Japan | 62-148942 |

[51] Int. Cl.$^5$ ............ H01L 39/10; H01L 39/22; H01L 29/00; H01B 12/00
[52] U.S. Cl. .................. 505/1; 357/5; 357/16; 357/17; 505/702; 505/817; 427/62; 427/63
[58] Field of Search .......... 357/4, 5, 6, 55, 16, 357/17; 505/874, 1, 702

[56] References Cited

U.S. PATENT DOCUMENTS

| 4,316,785 | 2/1982 | Suzuki et al. | 357/5 |
| 4,494,131 | 1/1985 | Ohta | 357/4 |
| 4,589,001 | 5/1986 | Sakai et al. | 357/5 |

Primary Examiner—Rolf Hille
Assistant Examiner—Mahshid Saadat

[57] ABSTRACT

In a device wherein a region which includes a superconducting weak link or a Josephson junction is irradiated with light or an electromagnetic wave so as to detect the light or an electromagnetic wave on the basis of the change of a superconducting critical current or an output voltage; a light-sensitive superconducting device characterized in that the surface of a superconductor lies in contact with a photoconductive semiconductor in at least a part of the whole of the region which is irradiated with the light or the electromagnetic wave.

52 Claims, 16 Drawing Sheets

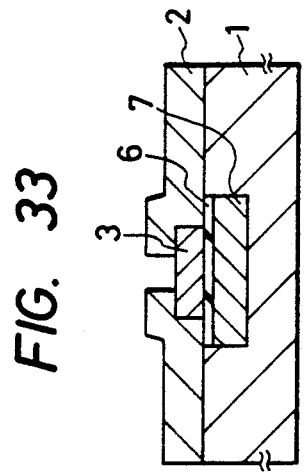
FIG. 30
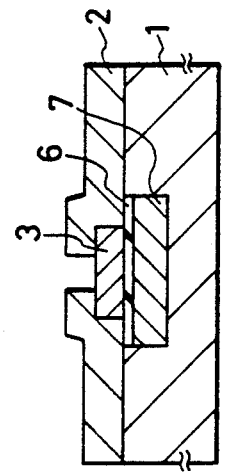
FIG. 31
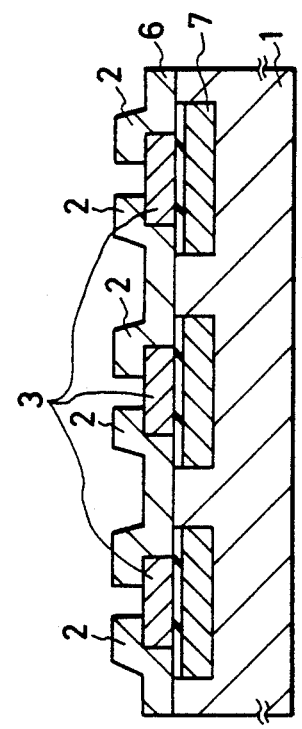
FIG. 32
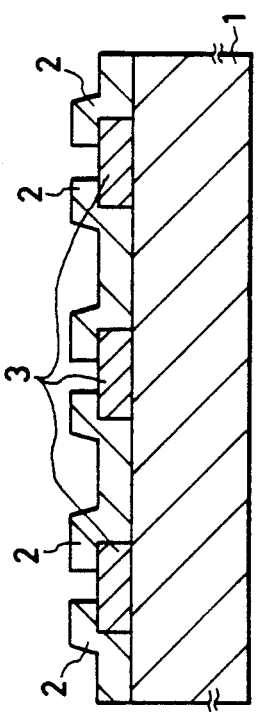
FIG. 33
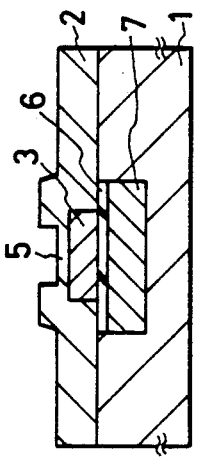
FIG. 34
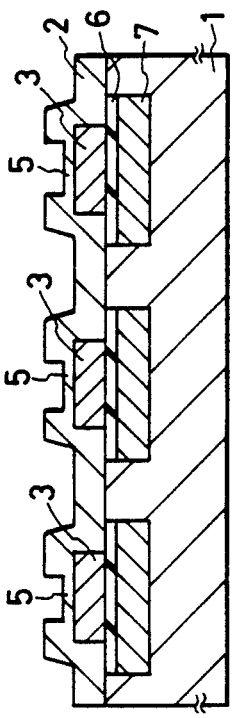

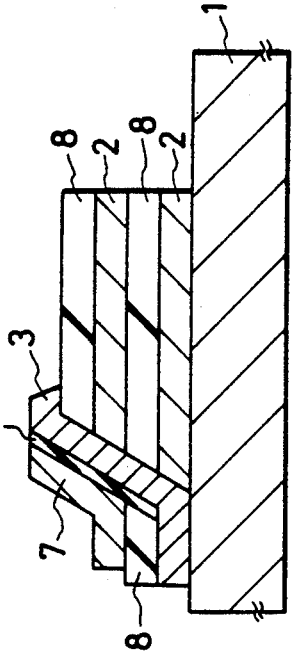
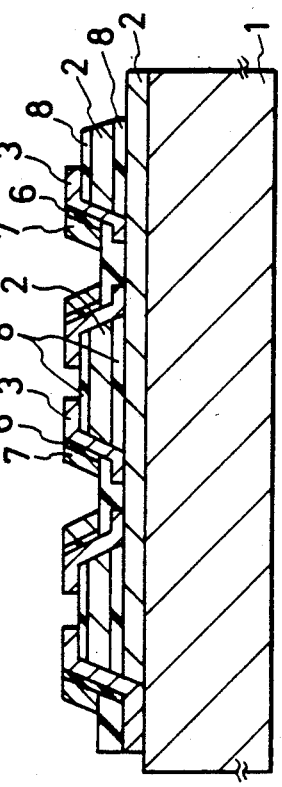
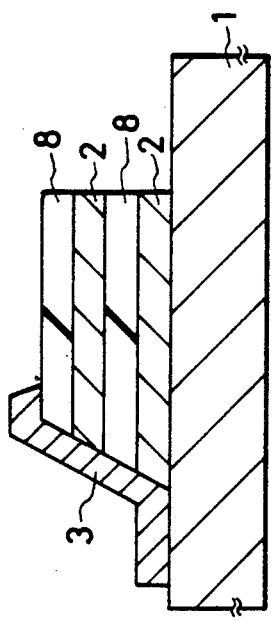
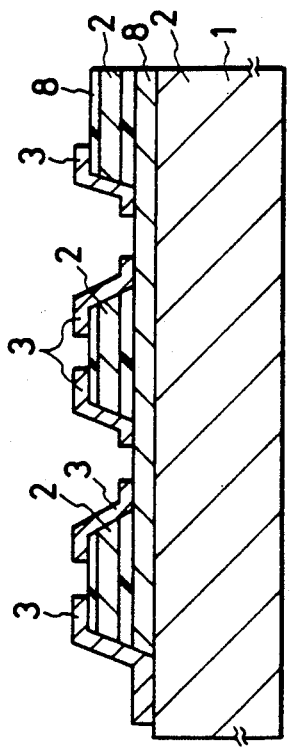

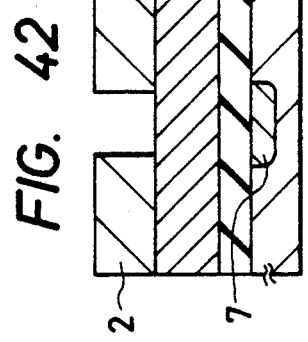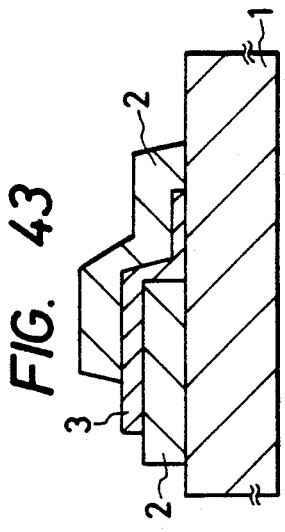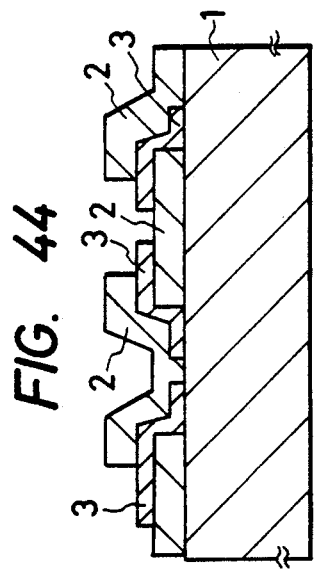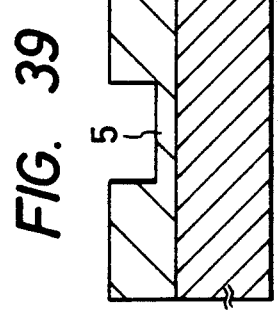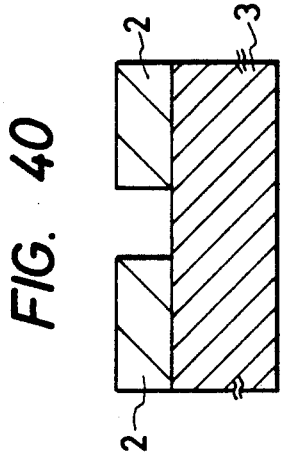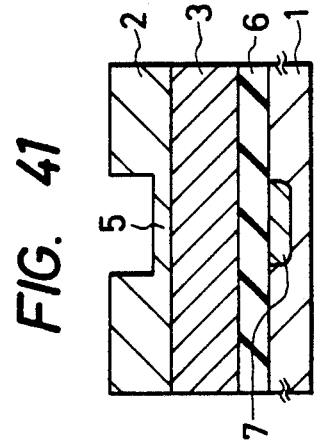

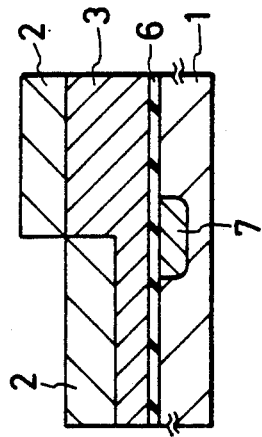
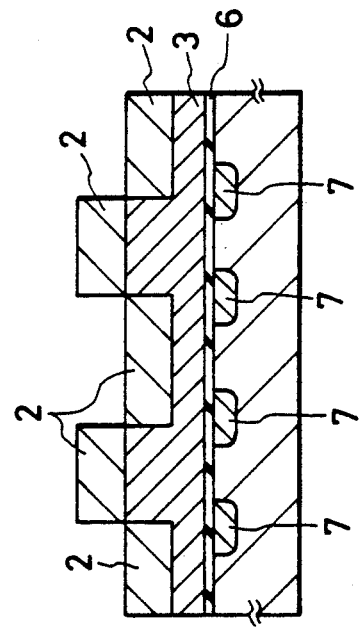
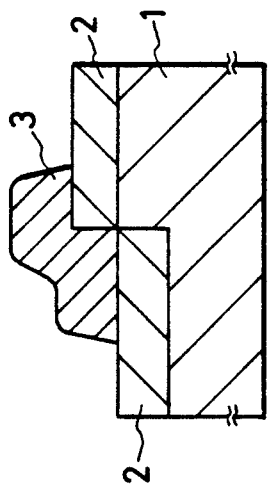
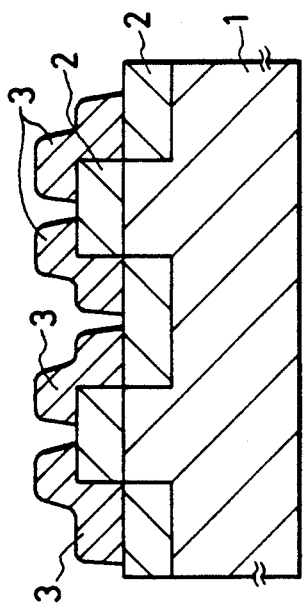

LIGHT DETECTING SUPERCONDUCTING JOSEPHSON DEVICE

BACKGROUND OF THE INVENTION

1. Field of the Invention

The present invention relates to a superconducting device employing a superconductor. More particularly, it relates to a light-sensitive superconducting device which detects light or an electromagnetic wave and also a superconducting switching device which is switched by irradiation with light or an electromagnetic wave.

2. Description of the Related Art

As a light-sensitive device employing a superconductor, a microbridge type Josephson junction device those bridge portion is irradiated with light is described in IEEE Transactions on Magnetics, MAG-17, No. 1, January 1981, pp. 88–91. A microbridge type Josephson junction device employing a superconductor expressed by $BaPb_xBi_{1-x}O_3$, the bridge portion of which is irradiated with light, is described in the official gazette of Japanese Patent Application Laid-open No. 130182/1985. A grain-boundary Josephson junction type light detector which utilizes the grain-boundary Josephson junction type light detector which utilizes the grain-boundary Josephson junction of a polycrystalline film of $BaPb_xBi_{1-x}O_3$, is described in the official gazette of Japanese Patent Application Laid-open No. 65582/1985 In addition, the official gazette of Japanese Application Laid-open No. 141582/1983 describes a sandwich type Josephson device the tunnel barrier of which is irradiated with light, whereby the current or voltage change of the tunnel barrier is detected owing to the effect of quasiparticle injection into a superconductor. Any of these prior-art techniques detects light by exploiting the fact that, when irradiated with the light, the superconductor constituting the Josephson device is influenced by quasiparticles (electrons or holes) excited within this superconductor, resulting in the change of the characteristic of the Josephson device.

Any of the prior-art techniques, however, directly irradiates the superconductor with the light and therefore has the problem that the light cannot be detected at a high sensitivity due to a high light reflectivity. Another problem is that, since the detection sensitivity of any of the devices lowers for the short wavelengths of the incident light, the device is applicable to only specified wavelengths.

Among the prior-art techniques, the expedient described in the official gazette of Japanese Patent Application Laid-open No. 65582/1985 detects light by utilizing the fact that, when the polycrystalline film made of the oxide-superconductor material is irradiated with the light, the Josephson junction produced at the crystal grain boundary thereof generates a voltage. In this case, the voltages which are generated at such crystal grain boundaries are not always constant, but they are somewhat different in the respective devices. Therefore, the expedient has the problem that the devices of uniform characteristics are difficult to be fabricated.

As a light-sensitive device employing a superconductor and a semiconductor, a sandwich type Josephson device the tunnel portions of which are made of a CdS film having pinholes is described in Physical Review Letters, Vol. 20, No. 23, pp. 1286–1289. This device forms tunnel junctions through the pinholes of the CdS film, and therefore has the problem that the characteristics of the junctions vary depending upon the numbers of the pinholes and are very difficult of control.

Further, this prior-art technique does not take into consideration the influence of a strain attributed to the thermal expansion of the superconductor as exerted on the characteristic of the device. More specifically, the strain in the material ascribable to a temperature cycle or a thermal shock induces the cracks or lattice defects of the material and affords a change to the characteristic of the device, to pose the problem that the operation of the device itself becomes unstable.

SUMMARY OF THE INVENTION

The first object of the present invention is to provide a light-sensitive superconducting device and a superconducting switching device each of which has a high detection sensitivity even for light or an electromagnetic wave within a range of shorter wavelengths.

The second object of the present invention is to provide a light-sensitive superconducting device and a superconducting switching device each of which permits products of uniform characteristics to be fabricated and can generate a great output voltage.

The third object of the present invention is to provide a light-sensitive superconducting device and a superconducting switching device each of which can diminish the variation of the characteristic of the device with time and can stabilize the operation of the device.

The first object mentioned above is accomplished in such a way that the weak link portion of a superconducting device to be irradiated with light or an electromagnetic wave is at least partially or wholly covered with a photoconductive semiconductor.

In a case where the superconducting weak link portion or a portion including a Josephson device is covered using the photoconductive semiconductor, carriers are excited in the photoconductive semiconductor even with wavelengths shorter than 500 μm, and they diffuse into a superconductor side and become quasiparticles in a superconductor. Thus, even when the wavelength of the incident light is approximately 0.2–50 μm, the carriers are efficiently created in the photoconductive semiconductor, and hence, the superconductor can be brought into a nonequilibrium state even in case of employing the light of the wavelengths within the above range at which the efficiency of creation of the quasiparticles in the superconductor is essentially low. In consequence, the detection of light at a high sensitivity becomes possible.

The photoconductive semiconductor for use in the present invention should desirably have a band gap of approximately 1.5–0.2 eV in correspondence with the wavelengths of the detection light. Further, even a photoconductive semiconductor whose band gap is approximately 0.2–0.01 eV operates satisfactorily. Accordingly, any of CdS, Si, InSb, Ge, GaAs, PbS, PbTe, etc. can be used as the material of the photoconductive semiconductor.

The second object mentioned above is accomplished in such a way that a superconductor and a photoconductive semiconductor are alternately arranged to form a plurality of Josephson junctions connected in series, and that light is detected by irradiating the junctions with the light. In this case, an oxide-superconductor can be employed as the superconductor. With, for example, an oxide-superconductor material which has a crystal structure similar to the perovskite type and whose composition is expressed by $YBa_2Cu_3O_{7-\delta}$ or $(La_{1-x}Sr_x)_2CuO_4$, a device of greater output voltage can be realized.

According to the present invention, the number of Josephson junctions each of which is switched between a voltage state and a superconducting state in accordance with the presence or absence of a light signal can be determined by a design beforehand. Therefore, voltages to be generated by individual devices are constant among the devices, and the variation of characteristics does not become a problem. Accordingly, the output signal of one switching device can be sent to another very easily. Further, the device is permitted to operate at a temperature of or above 77K with the aforementioned oxide-superconductor material $YBa_2Cu_3O_{7-\delta}$ and at a temperature of or above 40K with $(La_xSr_{1-x})_2CuO_4$.

In general, the output voltage of a Josephson junction decreases as the operating temperature of the Josephson junction approaches the superconducting transition temperature of a superconductor material constructing this Josephson junction. As regards this problem, according to the present invention, the number of Josephson junctions is enlarged beforehand, whereby a fixed output voltage can be generated. Thus, according to the present invention, the light-sensitive superconducting device can be operated at a still higher temperature than in the prior art.

It is needless to say that, in the oxide-superconductor materials mentioned above, Y may well be replaced with Sc, La, Pr, Nd, Sm, En, Gd, Tb, Dy, Ho, Er, Tm, Yb, Lu, Bi, Tl or the like, while Sr may well be replaced with Ba, Ca or the like. In addition, even when any of CdS, GaAs, Ge, Si, InSb, CdTe, etc. is employed as the photoconductive semiconductor, the object of the present invention can be satisfactorily accomplished.

The third object mentioned above is accomplished in such a way that the coefficients of thermal expansion of materials constituting a device are substantially equalized. This expedient can be realized by employing an oxide material of the same composition as the materials of both a superconductor and a semiconductor which constitute the device.

In a case where the superconductor material is a perovskite type superconductor material having a composition of $YBa_2Cu_3O_{7-\delta}$, the semiconductor material may well be a semiconductor material having a composition of $YBa_2Cu_3O_{7-\delta}$ ($\alpha > \delta$) in which oxygen is somewhat decreased. In this case, the coefficients of thermal expansion of the semiconductor and the superconductor become nearly equal. As the semiconductor material, the use of a material containing elements common to those of the superconductor as mentioned above is more advantageous for the process of manufacture, but this is not always restrictive. The object of the present invention can be satisfactorily accomplished when the materials the thermal expansion coefficients of which are substantially equal are employed.

Owing to the substantially equal coefficients of thermal expansion of the semiconductor and the superconductor, even when the device has undergone a thermal shock such as sudden cooling or temperature change, a great strain is not developed by the thermal expansion. Consequently, minute cracks are prevented from appearing within the semiconductor and the superconductor, the variations of characteristics with time are avoided, and the operation of the device can be stabilized. Moreover, since the superconductor and the semiconductor can be made of the material of the same composition, the variations of the device characteristics ascribable to the diffusion of any constituent element, etc. can be prevented.

As the superconductor material, a perovskite type oxide-superconductor material having a composition of $(La_xSr_{1-x})_2CuO_4$ may well be employed apart from $YBa_2Cu_3O_{7-\delta}$. In addition, Sc, La, Pr, Nd, Sm, En, Gd, Td, Dy, Ho, Er, Tm, Yb, Bi, or Tl Lu may well be used as a constituent element instead of Y. Besides, Sr may well be replaced with Ba or Ca.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 1 is a sectional view showing a part of a superconducting device according to the first embodiment of the present invention, while

DETAILED DESCRIPTION OF THE PREFERRED EMBODIMENTS

Figure 1:
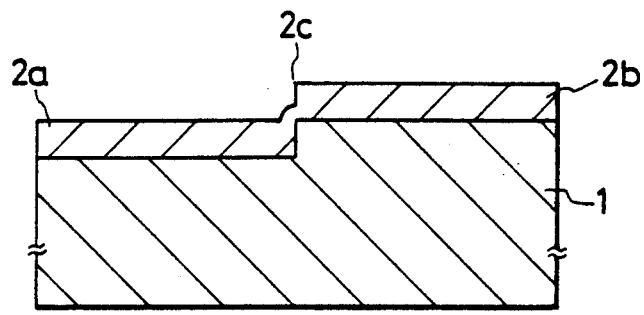

Now, embodiments of the present invention will be described with reference to the drawings.

[Embodiment 1]

The first embodiment of the present invention will be described with reference to FIG. 1.

On an MgO single-crystal substrate 1 having the (001)-plane orientation, a stepped portion 2c which has a height or level difference of about 4 μm is formed by mechanical polish. Subsequently, an oxide film which is about 2 μm thick is formed on the substrate 1 including the stepped portion 2c, by rf-sputtering which employs a target having a composition of $YBa_2Cu_3O_{7-\delta}$. The oxide film is annealed in the air at a temperature of 950° C. for 2 hours. Thus, the oxide film turns into oxide-superconductor portions 2a and 2b. In this case, it is desirable for forming the superconducting weak link between the oxide-superconductor portions 2a and 2b that the height of the stepped portion 2c is selected to be about 1-5 times as great as the thickness of the oxide-superconductor portions 2a, 2b. In the embodiment of FIG. 1, accordingly, the oxide-superconductor portions 2a and 2b are weakly linked in superconducting fashion by the stepped portion 2c. In the above way, the superconducting device of the first embodiment is realized.

In this case, owing to the stepped portion of the substrate or subbing material, the oxide-superconductor film is made thinner in the stepped portion than in the other portion so as to concentratively form superconducting weak link parts in the stepped portion, whereby the effective size of the Josephson junction or superconducting weak link can be made small.

As taught in the prior art, the Josephson junction parts or superconducting weak link parts are formed at crystal grain boundaries in the polycrystalline film of the oxide-superconductor, and the whole film is the aggregate of the Josephson junction parts. In order to utilize the oxide-superconductor film for an electron device, therefore, the microfabrication of the film is required. Usually, the grain diameters of the oxide-superconductor film are about 1-5 $\mu$m. In case of the microfabrication smaller than the grain diameters, the Josephson junction parts at the crystal grain boundaries are degraded, and hence, good junction characteristics cannot be attained.

In contrast, in the case of using the stepped portion as in the present embodiment, the Josephson junction parts are formed in a manner to concentrate in the stepped portion, and the superconducting link of this portion is sufficiently weaker than the links of the Josephson junction parts formed in the other portions within the film. Accordingly, when the oxide-superconductor film is formed on the surface of the substrate including the stepped portion, the Josephson junction or superconducting weak link can be formed in only a region along the stepped portion. Therefore, it becomes possible to diminish the dimensions of the device and to heighten the density of integration of circuitry.

Although $YBa_2Cu_3O_{7-\delta}$ was employed as the material of the oxide-superconductor in an example of the embodiment, it may well be replaced with any of materials such as $(La_{1-x}Sr_x)_2CuO_4$. In this case, Sr may well be replaced with Ba or Ca, and Y may well be replaced with any of Sc, La, Ce, Pr, Nd, Pm, Sm, Eu, Gd, Tb, Dy, Ho, Er, Tm, Yd Lu, Bi and Tl.

Although MgO was employed as the substrate or subbing material, any of $ZrO_2$, $Al_2O_3$, $SrTiO_3$, yttrium stabilized zirconium, etc. may be alternatively employed, and a material such as $SiO_2$, Si or garnet may well be employed.

Next, a quantum interference device constructed on the basis of the superconducting device in FIG. 1 will be described with reference to FIG. 2.

Figure 2:
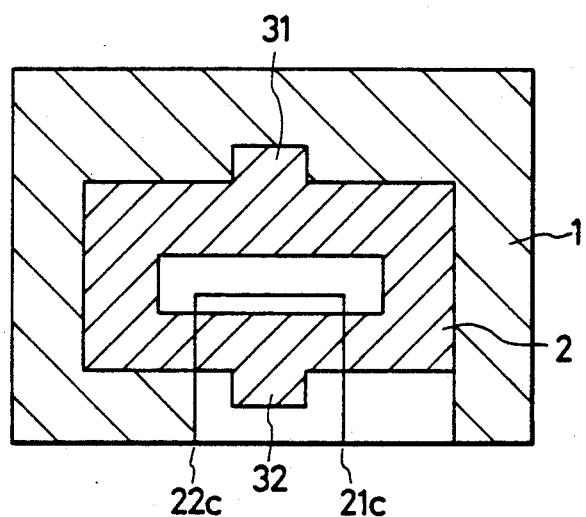
FIG. 2 is a plan view showing a quantum interference device which includes the superconducting device in FIG. 1.

Using materials and a method similar to those of the embodiment in FIG. 1, the surface of a substrate 1 is formed with regions which are partly higher or lower than the surroundings, thereby to provide stepped portions 21c and 22c. Subsequently, an oxide-superconductor 2 is formed on the whole surface of the substrate 1. Thereafter, it is processed into a hatched pattern by Ar ion etching or by chemical etching with dilute nitric acid. In this way, the superconducting quantum interference device which includes two Josephson junctions can be realized. This device is cooled down to 77K by the use of liquid nitrogen, and is operated as the quantum interference device. On this occasion, a signal is detected through lead-out electrodes 31 and 32.

As described above, according to the present embodiment, in a superconducting device which employs an oxide-superconductor, there are produced the effects that the size of a Josephson junction or superconducting weak link can be reduced and that the density of integration of a circuit employing a superconducting device adapted to operate at a higher temperature can be heightened.

[Embodiment 2]

Now, the second embodiment of the present invention will be described.

Figure 3:
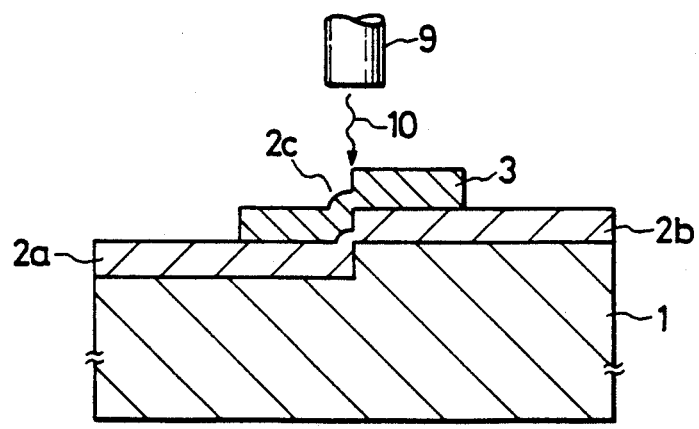
FIG. 3 is a sectional view showing a part of a light-sensitive superconducting device according to the second embodiment of the present invention.
Figure 4:
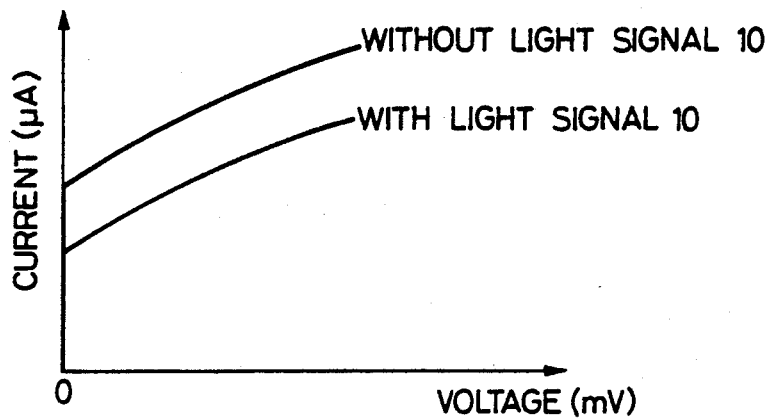
FIG. 4 is a graph showing the characteristics of the light-sensitive superconducting device in FIG. 3, and FIGS. 5 and 6 are sectional views each showing a modification of the light-sensitive superconducting device in FIG. 3.

FIG. 3 is a view showing the vertical sectional structure of the light-sensitive superconducting device of the present embodiment. This light-sensitive superconducting device has the structure in which a photoconductive semiconductor film 3 made of CdS and having a thickness of about 3 $\mu$m is formed on the stepped portion 2c of a superconducting device having the same construction as that of the embodiment in FIG. 1. Means 9 for projecting light is provided over the photoconductive semiconductor film 3 of the light-sensitive superconducting device. As the light projection means 9, an optical fiber connected to an external light source is employed. A light signal 10 emerges from the light projection means 9, and falls on the photoconductive semiconductor film 3. The superconducting critical current of the superconducting device is decreased by the incidence of the light signal 10 on the photoconductive semiconductor film 3. This situation is illustrated in FIG. 4. In the example of FIG. 4, the light signal 10 was light having a wavelength of 0.7 $\mu$m. As seen from FIG. 4, the current to flow through the light-sensitive superconducting device, namely, the superconducting current to flow across the superconducting electrodes 2a and 2b exhibits different magnitudes in accordance with the presence and absence of the light signal 10.

Next, modifications of the present embodiment will be described with reference to FIGS. 5 and 6.

Figure 5:
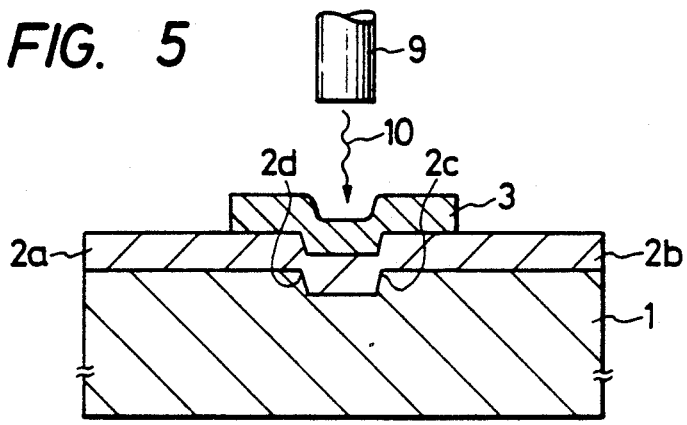

The modification in FIG. 5 is fabricated by the same steps as those of the device in FIG. 3 except that a groove having a depth of about 5 $\mu$m is provided in the surface of the MgO single-crystal substrate 1 in order to form stepped portions 2c and 2d. Thus, the oxide-superconductor becomes thinner and falls into weak-link states on the stepped portions 2c and 2d. A photoconductive semiconductor (CdS) film 3 having a thickness of about 200 nm is formed on oxide-superconductor portions 2a and 2b which include parts corresponding to the stepped portions 2c and 2d. In operation, when a light signal 10 of visible light is applied from an optical fiber 9 to the photoconductive semiconductor (CdS) 3, a nonequilibrium state based on the light arises. Further, the photoconductive semiconductor (CdS) 3 exhibits a photoconductivity owing to carriers created within the film thereof. Accordingly, the current-voltage characteristic of the device changes through the superconducting proximity effect in which the superconductivity of the superconductor films 2a and 2b lying in contact with the photoconductive semiconductor (CdS) 3 changes.

Figure 6:
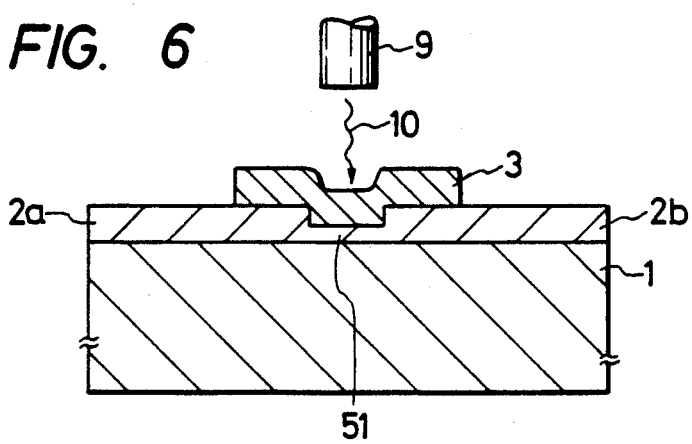

The modification in FIG. 6 has no stepped portions (2c, 2d) in a substrate 1. Accordingly, an oxide-superconductor 2 (2a, 2b) is partly processed over a length of 5-10 $\mu$m so as to reduce the thickness of the part to $\frac{1}{4}$-1/10 of that of the other part. A weak link portion 51 is thus prepared, and a photoconductive semiconductor 3 is formed thereon. Also in this case, the superconducting critical current of the superconducting weak link portion 51 decreases owing to the projection of light, so that a switching operation can be realized.

In the above embodiment, a material such as $(La_{1-x}Sr_x)_2CuO_4$ or $YBa_2Cu_3O_{7-\delta}$ can be used as the material of the oxide-superconductor 2. Further, Sr may well be replaced with Ba or Ca, and Y may well be replaced with Sc, La, Ce, Pr, Nd, Pm, Sm, Eu, Gd, Tb, Dy, Ho, Er, Tm, Yb, Lu, Bi and Tl.

MgO was employed as the material of the substrate 1 or subbing layer in the examples. Alternatively, any of $ZrO_2$, $Al_2O_3$, $SrTiO_3$, yttrium stabilized zirconium, etc. is desirably used, but a material such as $SiO_2$, Si or garnet may well be used.

As the photoconductive semiconductor 3, CdS was employed in the examples. Alternatively, a material such as Si, InSb, Ge, GaAs, PbS or PbTe may well be used.

According to the embodiment stated above, in a light-sensitive device employing a superconductor, the detection sensitivity of light can be heightened in a wider range of wavelengths. As a result, the embodiment brings forth the advantages that a laser, a light emitting diode or the like in the field of conventional semiconductor devices can be used as a light source, and that the function of the light-sensitive device can be enhanced.

[Embodiment 3]

Now, the third embodiment of the present invention will be described.

Figure 7:
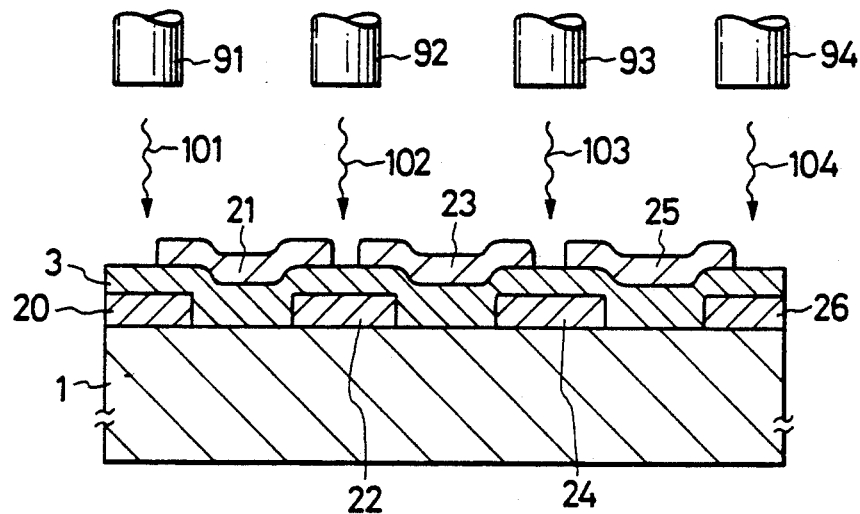
FIG. 7 is a sectional view showing a part of a light-sensitive superconducting device according to the third embodiment of the present invention.
Figure 8:
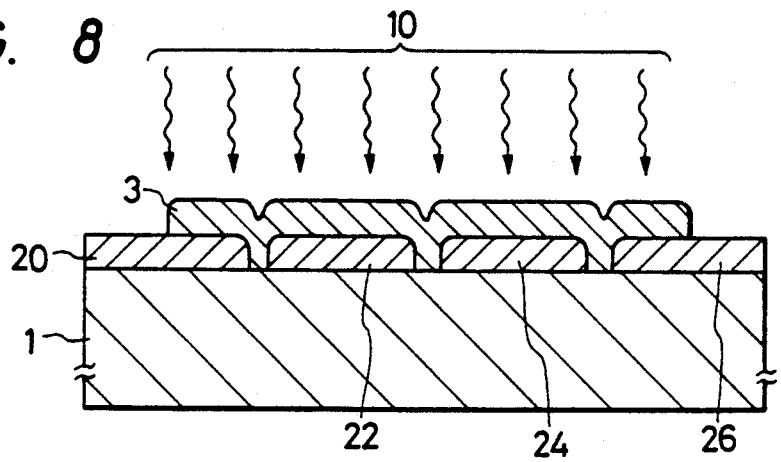
FIG. 8 is a sectional view showing a modification of the light-sensitive superconducting device in FIG. 7.

FIGS. 7 and 8 are views each showing the vertical sectional structure of a light-sensitive superconducting device.

Figure 9:
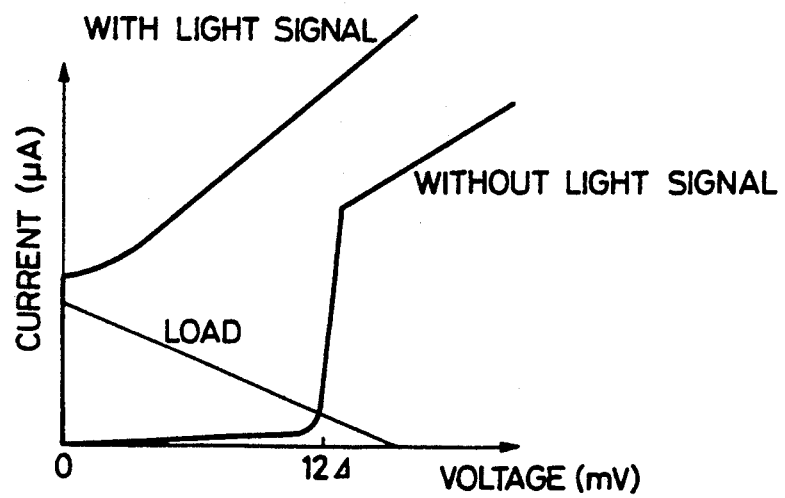
FIG. 9 is a graph showing the operating characteristics of the light-sensitive superconducting device in FIG. 7.

Referring to FIG. 7, a film which is about 400 nm thick and which has a composition of $YBa_2Cu_3O_{7-\delta}$ is formed on a sapphire substrate 1 having a thickness of about 500 μm by rf-sputtering which employs a target having a composition of $YBa_2Cu_3O_{6.5}$. The film is annealed at 900° C. in the air for 1 hour in order to turn it into an oxide-superconductor having a layered perovskite structure. Subsequently, the oxide-superconductor is processed by Ar ion etching or by wet etching with dilute nitric acid, thereby to form superconductor portions 20, 22, 24 and 26 which are spaced at predetermined intervals. At the next step, CdS which is about 20 nm thick is evaporated by resistance heating, thereby to form a photoconductive semiconductor 3 so as to cover the superconductor portions 20, 22, 24 and 26. The evaporation is carried out through a metal mask, and a required pattern is formed. Next, a film which is about 400 nm thick and whose composition is $YBa_2Cu_3O_{7-\delta}$ is formed on the whole area of the photoconductive semiconductor 3 by rf-sputtering. Thereafter, this film is annealed at 400° C. in oxygen for 1 hour, and it is processed by Ar ion etching into oxide-superconductor portions 21, 23 and 25. The respective oxide-superconductor portions 21, 23 and 25 are formed over the interspaces of the adjacent oxide-superconductor portions 20, 22, 24 and 26 in a manner to cover parts of the corresponding portions. In the above way, the light-sensitive superconducting device of the present embodiment is fabricated. When the light-sensitive superconducting device is put in and cooled by liquid nitrogen and is irradiated with light signals 101–104 by light projection means 91–94, the current-voltage characteristics of this device change as illustrated in FIG. 9, and the light signals can be detected to deliver an output signal. FIG. 9 shows the operation of the light-sensitive superconducting device. In the absence of the light irradiation, an output voltage which is about 12 times as great as Δ can be obtained by selecting a load as indicated in FIG. 9. On the other hand, in the presence of the light irradiation, the output voltage of the device is zero. In the example shown in FIG. 7, six Josephson junctions are connected in series. Therefore, letting Δ denote the magnitude of the superconducting energy gaps between the oxide-superconductor portions 20, 22, 24, 26 and those 21, 23, 25, the output signal which is 12 times greater than Δ can be produced. The multiplying factor is determined by the number of Josephson junctions arrayed in series. Accordingly, the value of an output voltage can be determined by a design. In general, the superconducting energy gap Δ varies with temperatures. In particular, it decreases with a temperature rise when the temperature becomes close to a superconducting transition temperature. Accordingly, also the output voltage of the light detection decreases. In such a case, the number of Josephson junctions to be arrayed in series is increased beforehand, whereby an output voltage is fixed, and a light-sensitive device operating at a higher temperature can be realized.

Next, a modification of the third embodiment will be described with reference to FIG. 8. On a sapphire substrate 1 which is about 500 μm thick, a film which has a composition of $YBa_2Cu_3O_{7-\delta}$ and which is about 500 nm thick is formed by rf-sputtering and using a target whose composition is $YBa_2Cu_3O_{6.5}$. Thereafter, the film is annealed at 950° C. in the atmospheric air for 2 hours, to form an oxide-superconductor having a layered perovskite structure. Subsequently, the oxide-superconductor is processed by Ar ion etching or by wet etching with dilute nitric acid, to form superconductor portions 20, 22, 24 and 26 which are spaced at predetermined intervals. Each of the intervals has a width of about 0.1 μm–0.5 μm. Further, a CdS film is deposited to a thickness of about 300 nm through a metal mask by resistance-heated evaporation, thereby to form a photoconductive semiconductor 3. In the present embodiment, Josephson junctions are formed by the end parts of the two opposing oxide-superconductor portions 20 and 22, 22 and 24, and 24 and 26 and the intervening parts of the photoconductive semiconductor. In the present embodiment, the device includes the three Josephson junctions connected in series. Accordingly, an output voltage which is about 6 times as great as the magnitude of a superconducting energy gap Δ can be produced by irradiation with a light signal 10.

Although, in the above examples, $YBa_2Cu_3O_{7-\delta}$ was used as the oxide-superconductor, it may well be replaced with $(La_xSr_{1-x})_2CuO_4$ as indicated in the second embodiment stated before. Besides, any of Si, GaAs, Ge, etc. may well be used as the material of the photoconductive semiconductor as also indicated in the second embodiment.

As described above, according to the present embodiment, in a light-sensitive device employing an oxide-superconductor, an output signal can be enlarged, and the extent of the enlargement can be changed by a design beforehand. Therefore, the articles of the device can be manufactured with uniform magnitudes of output signals, which makes it possible to heighten the available percentage of the articles in fabrication. Moreover, since the output voltage of the device becomes greater, the connections thereof with various devices are facilitated. Furthermore, even when the device is operated at a temperature close to the critical temperature of the superconductor, the output voltage can be rendered sufficiently great, so that the device can be used at a higher temperature than in the case of the prior art, and the cooling thereof is facilitated.

[Embodiment 4]

Now, modifications of Embodiments 2 and 3 will be described in detail.

Figure 10:
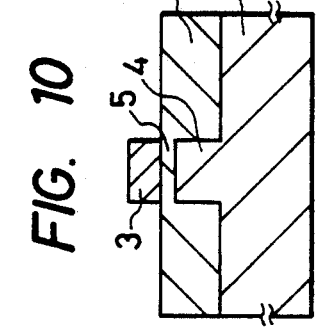
FIGS. 10 thru 65 are views showing various modifications (as the fourth embodiment) of the second and third embodiments.

The first modification will be detailed with reference to FIG. 10. The surface of a substrate 1 which is made of an MgO single crystal having the (001)-plane orientation is provided with a protrusion 4 by mechanical polish. The height of the protrusion 4 is set at about 4 $\mu$m. This value may be selected within a range of about 1-10 times, more desirably about 1-3 times, the thickness of a weak link portion 5 in an oxide-superconductor 2 which is subsequently formed. The film of the oxide-superconductor 2 having a thickness of about 2 $\mu$m is formed by rf-sputtering from a target with a composition of $YBa_2Cu_3O_{7-\delta}$ and then subjecting the oxide-superconductor to annealing at 950° C. for 2 hours.

Figure 11:
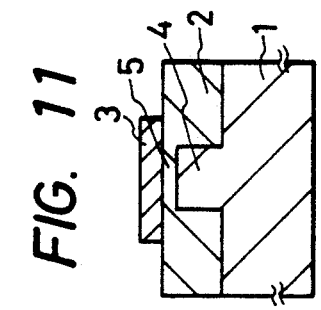

The superconducting weak link portion 5 is thus formed on the protrusion 4, and it is overlaid with a photoconductive semiconductor 3 which is made of CdS and which is about 3 $\mu$m thick. The thickness of the photoconductive semiconductor 3 was set at 3 $\mu$m in this example. However, the thickness may well be less, and it is desirable for raising the operating speed of the device that the thickness falls within a range of 0.1-1 $\mu$m. Further, the photoconductive semiconductor 3 may well be larger than the top surface of the protrusion 4 in a manner to completely cover this top surface, as illustrated in FIG. 11.

Figure 12:
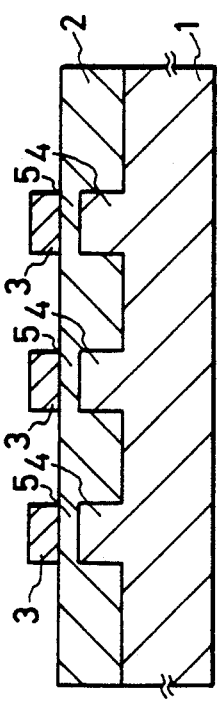

Next, the second modification will be described with reference to FIG. 12. The present modification is such that the light-sensitive superconducting devices as shown in FIG. 10 are connected in series. The fabrication of the device is substantially the same as that of the first modification, but a plurality of protrusions 4 need to be formed at the surface of a substrate 1.

Next, the third modification will be described with reference to FIG. 13. A photoconductive semiconductor 3 made of CdS is formed with a protrusion 4 by reactive ion etching, and an oxide-superconductor 2 having a composition of $YBa_2Cu_3O_{7-\delta}$ is formed on the surface of the photoconductive semiconductor. The height of the protrusion 4 should desirably be selected at 0.01-1 times the thickness of the film of the oxide-superconductor, but it may well be greater. Subsequently, the surface of the oxide-superconductor is flattened by an etching process based on reactive ion etching, thereby to form a weak link portion 5. Next, the resulting structure is subjected to annealing at 950° C. for 2 hours. Then, a light-sensitive device is finished up.

Figure 14:
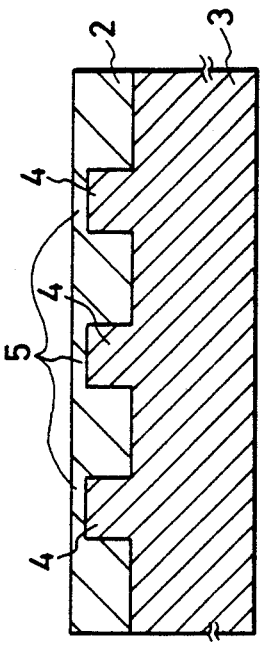

Next, the fourth modification will be described with reference to FIG. 14. The present modification is such that the light-sensitive superconducting devices as shown in FIG. 13 are connected in series. The fabrication of the device is substantially the same as that of the modification in FIG. 13, but a plurality of protrusions 4 need to be formed.

Next, the fifth modification will be described with reference to FIG. 15. An oxide-superconductor 2 is not formed with the weak link portion as shown in the modification of FIG. 11. Two superconducting electrodes are spaced with a protrusion 4 held therebetween, and a superconducting weak link portion is constructed through a photoconductive semiconductor 3.

It is desirable that the width of the protrusion 4 lies within a range of 0.1-1.0 $\mu$m. A substrate 1 made of MgO is provided with the protrusion 4 having a height of 1 $\mu$m by reactive ion etching, and the oxide-superconductor portions 2 being 1 $\mu$m thick and having a composition of $YBa_2Cu_3O_{7-\delta}$ is provided on both the sides of the protrusion. Subsequently, the resulting structure is annealed at 950° C. in an oxygen atmosphere for 2 hours. Thereafter, the photoconductive semiconductor 3 made of CdS and having a thickness of 2 $\mu$m is formed so as to cover the whole surface of the protrusion 4 and parts of the oxide-superconductor portions. Then, a light-sensitive device is finished up.

Next, the sixth modification will be described with reference to FIG. 16. The present modification is such that the light-sensitive superconducting devices as shown in FIG. 15 are connected in series. The fabrication of the device is substantially the same as that of the fifth modification, but a plurality of protrusions 4 need to be formed at the surface of a substrate 1.

Next, the seventh modification will be described with reference to FIG. 17. This device is not formed with the weak link portion which is prepared by thinning a part of the oxide-superconductor 2 as shown in the modification of FIG. 13, and the oxide-superconductor portions 2 are spaced through a protrusion 4 made of a photoconductive semiconductor 3. The photoconductive semiconductor 3 made of CdS is processed by reactive ion etching, to form the protrusion 4 whose height is 1 $\mu$m and whose width is selected from within a range of 0.1-1.0 $\mu$m. Subsequently, the oxide-superconductor portions 2 which are 1 $\mu$m thick and whose composition is $YBa_2Cu_3O_{7-\delta}$ are provided on both the sides of the protrusion 4, and are annealed at 950° C. in an oxygen atmosphere for 2 hours. Then, the light-sensitive device is finished up.

Next, the eighth modification will be described with reference to FIG. 18. The present modification is such that the light-sensitive superconducting devices as shown in FIG. 17 are connected in series. The fabrication of the device is substantially the same as that of the modification in FIG. 17, but a plurality of protrusions 4 need to be formed.

Figure 19:
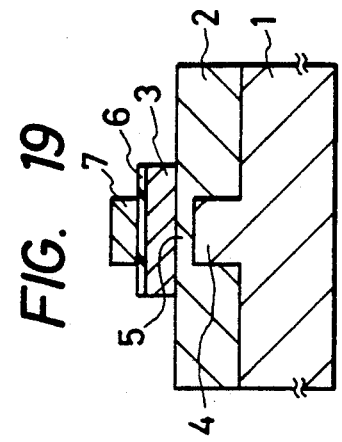

Next, the ninth modification will be described with reference to FIG. 19. This device is such the device shown in the modification of FIG. 10 is additionally provided with a control electrode 7 for exerting an electric field effect. A voltage is applied to the control electrode 7 so as to subject the photoconductive semiconductor 3 to a fixed amount of carrier change beforehand, whereby the great change of a superconducting current can be attained in response to a minute signal. That is, the device of the present modification utilizes both the field effect and a photoelectric effect and has a higher gain to realize the detection of high sensitivity and high speed. In addition to the method of fabricating the device in the modification of FIG. 10, an insulator film 6 which is made of $SiO_2$ and which is 100 nm thick is formed on the surface of the photoconductive semiconductor 3 by CVD. Further, the control electrode 7 which is made of Nb and which is 500 nm thick is formed by dc magnetron sputtering. When this device is irradiated with light, a superconducting weak link type light-sensitive device whose superconducting current is changed by the incident light can be realized. When light having a wavelength of 0.7 $\mu$m is caused to enter this light-sensitive superconducting device, the superconducting current of the device decreases, and the device can effect a switching operation.

Figure 20:
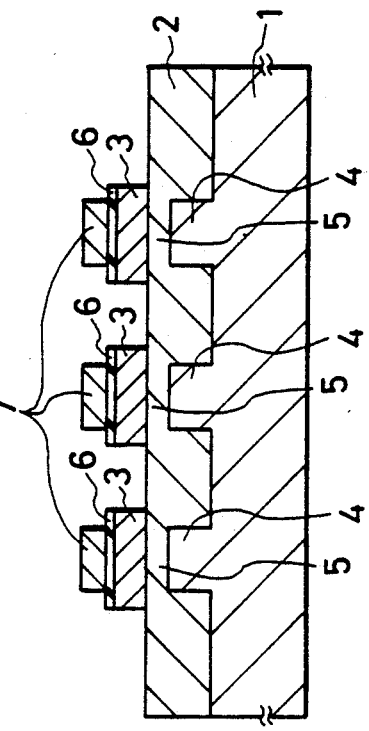

Next, the tenth modification will be described with reference to FIG. 20. The present modification is such that the light-sensitive superconducting devices as shown in FIG. 19 are connected in series. It can enlarge an output signal based on the projection of light. Accordingly, it has the advantage that the light detection sensitivity thereof can be enhanced. The fabrication of the device can be readily realized by a method which is substantially the same as that of the modification in FIG. 19.

Figure 21:
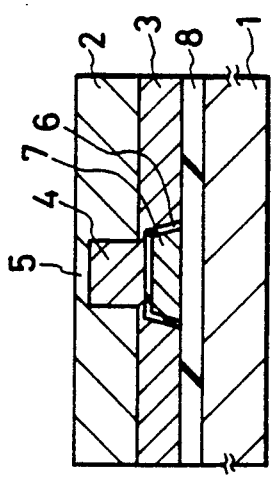

Next, the eleventh modification will be described with reference to FIG. 21. This device is such that the device in FIG. 13 is additionally provided with a control electrode 7 for exerting an electric field effect.

Figure 13:
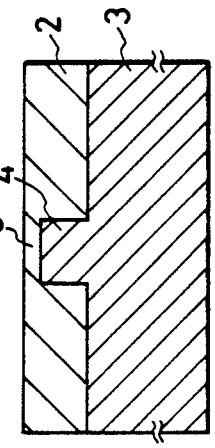

Besides the method of fabricating the device in FIG. 13, the control electrode 7 which is made of Nb and which is covered with an insulator film 6 made of $SiO_2$ is provided in the rear surface of the photoconductive semiconductor 3.

An example was fabricated as follows: On a substrate 1, an insulator film 8 made of $Al_2O_3$ and being about 200 nm thick was formed by rf-sputtering. Subsequently, a film made of Nb and being about 200 nm thick was formed by dc magnetron sputtering and was processed by reactive ion etching and using a photoresist as a mask, whereby a control electrode 7 was provided. Further, a gate insulator film 6 made of $SiO_2$ and having a thickness of 40 nm was formed by sputtering. Thenceforth, the same manufacturing steps as those of the device shown in FIG. 13 were carried out. Then the light-sensitive superconducting device of the present embodiment could be realized.

When this device is irradiated with light, a superconducting weak link type light-sensitive device whose superconducting current is changed by the incident light can be realized. When light having a wavelength of 0.7 μm is caused to enter this light-sensitive superconducting device, the superconducting current of the device decreases, and the device can perform a switching operation.

Figure 22:
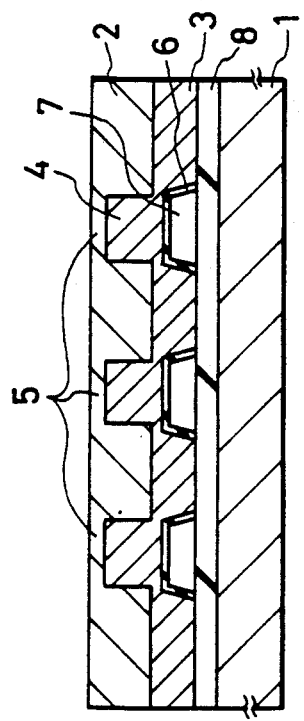

Next, the twelfth modification will be described with reference to FIG. 22. The present modification is such that the light-sensitive superconducting devices as shown in FIG. 21 are connected in series. The fabrication of the device of the present modification can be readily realized by substantially the same method as in the modification of FIG. 21.

Figure 23:
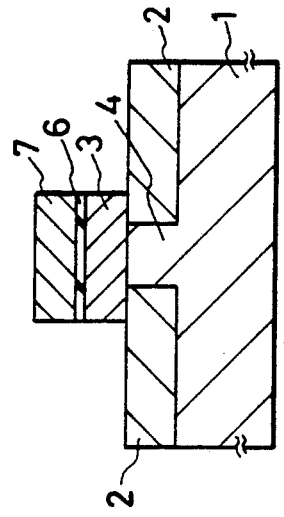

Next, the thirteenth modification will be described with reference to FIG. 23. This device is such that the device in FIG. 15 is additionally provided with a control electrode 7 for exerting an electric field effect.

Figure 15:
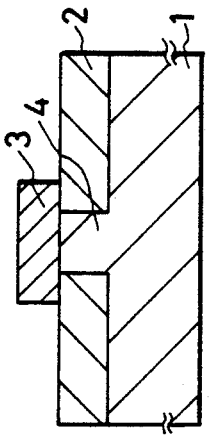
Figure 16:
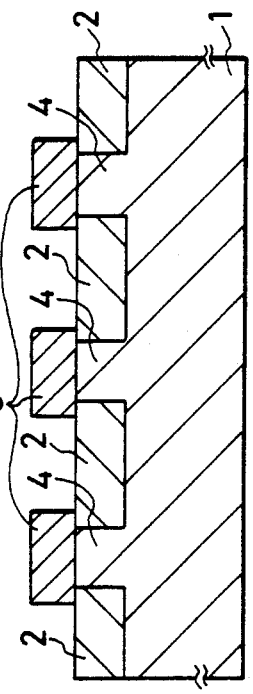

Besides the method of fabricating the device in FIG. 15, an insulator film 6 made of $SiO_2$ and being 100 nm thick is formed on the surface of the photoconductive semiconductor 3 by CVD. Further, the control electrode 7 made of Nb and being 500 nm thick is formed by dc magnetron sputtering.

Figure 24:
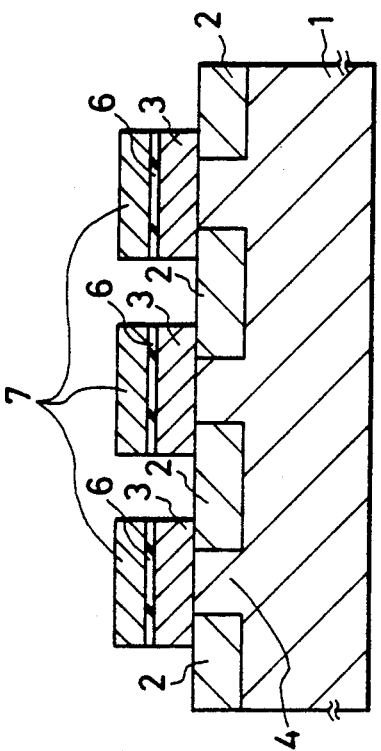

Next, the fourteenth modification will be described with reference to FIG. 24. The present modification is such that the light-sensitive superconducting devices as shown in FIG. 23 are connected in series. The fabrication of the device can be readily realized by substantially the same method as in the modification of FIG. 23.

Figure 25:
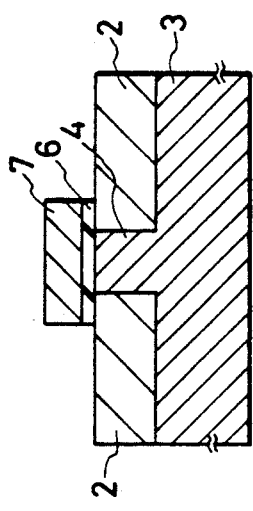

Next, the fifteenth modification will be described with reference to FIG. 25. This device is such that the device in FIG. 17 is additionally provided with a control electrode 7 for exerting an electric field effect.

Figure 17:
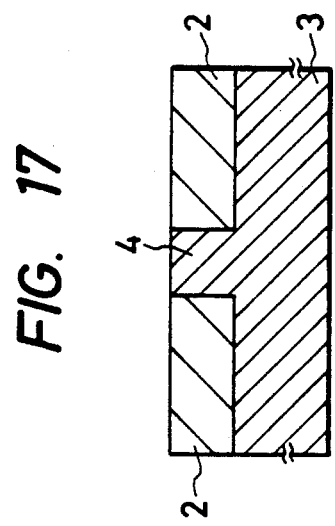
Figure 18:
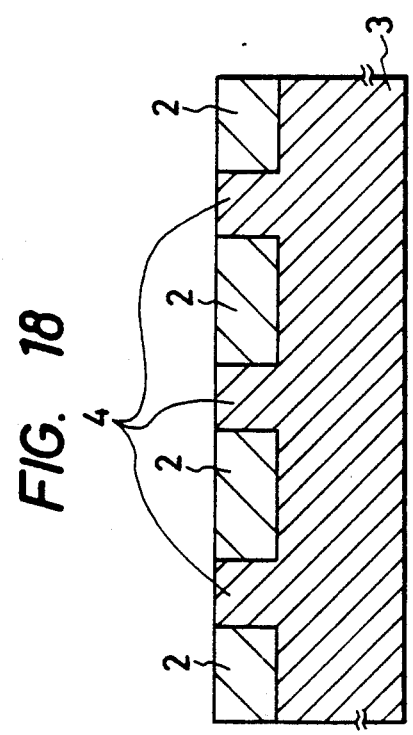

In addition to the method of fabricating the device in FIG. 17, an insulator film 6 made of $SiO_2$ and being 100 nm thick is formed on the top surface of the protrusion 4 of the photoconductive semiconductor 3 by CVD. Further, the control electrode 7 made of Nb and being 500 nm thick is formed by dc magnetron sputtering.

Figure 26:
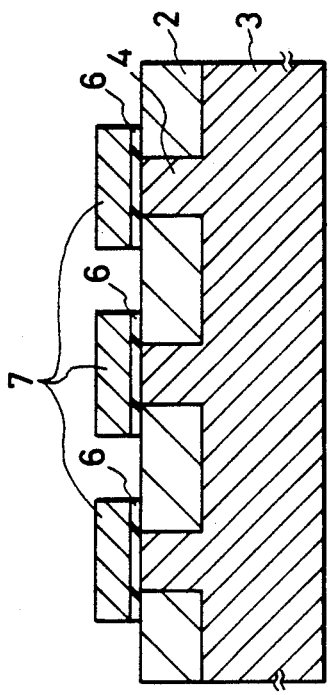

Next, the sixteenth modification will be described with reference to FIG. 26. The present modification is such that the light-sensitive superconducting devices as shown in FIG. 25 are connected in series. The fabrication of the device can be readily realized by substantially the same method as in the modification of FIG. 25.

Figure 27:
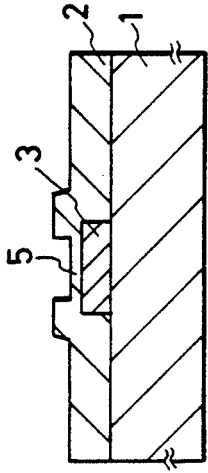

The seventeenth modification will be described with reference to FIG. 27. On a substrate 1 which is made of an MgO single crystal having the (001) orientation, a photoconductive semiconductor 3 made of Si and having a thickness of 500 nm is formed by vacuum evaporation. This photoconductive semiconductor is processed by chemical etching which employs a photoresist as a mask. Thereafter, an oxide-superconductor 2 having a composition of $YBa_2Cu_3O_{7-\delta}$ and being about 700 nm thick is formed by sputtering which employs Ar gas. Subsequently, at least a part of the oxide-superconductor 2 overlying a part or the whole of the photoconductive semiconductor 3 is removed by the ion beam of argon, whereby a weak link portion 5 is formed. In the above way, the device of the present invention can be realized. When light is projected on the weak link portion 5 of the device, the superconducting current of the device changes to afford a switching operation.

Figure 28:
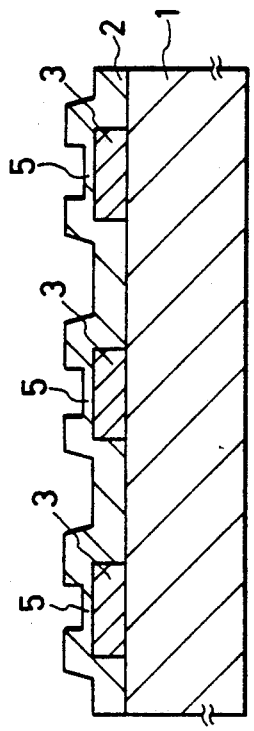

Next, the eighteenth modification will be described with reference to FIG. 28. The present modification is such that the light-sensitive superconducting devices as shown in FIG. 27 are connected in series. The fabrication of the device can be readily realized by substantially the same method as in the modification of FIG. 27. Since, however, the plurality of devices are connected in series, a plurality of patterns of the photoconductive semiconductor 3 made of CdS need to be arrayed and formed.

Figure 29:
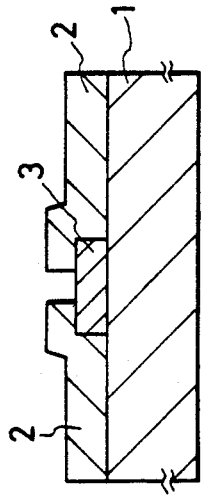

The nineteenth modification will be described with reference to FIG. 29. On a substrate 1 which is made of an MgO single crystal having the (001) orientation, a photoconductive semiconductor 3 made of Si and having a thickness of 300 nm is formed by vacuum evaporation. This photoconductive semiconductor is processed by chemical etching which employs a photoresist as a mask. Thereafter, an oxide-superconductor 2 having a composition of $YBa_2Cu_3O_{7-\delta}$ and being about 900 nm thick is formed by sputtering which employs Ar gas. Subsequently, at least a part of the oxide-superconductor 2 overlying a part or the whole of the photoconductive semiconductor 3 is removed with the ion beam of argon by employing as a mask a resist pattern which has been formed using an electron beam resist and electron beam lithography. In the above way, the device can be realized. When light is projected on the region of the device including the photoconductive semiconductor 3, the superconducting current of the device changes to afford a switching operation. The present modification is characterized in that the photoconductive semiconductor 3 is located on the side of the oxide-superconductor 2 closer to the substrate 1. In this case, there is the advantage that the boundary of the photoconductive semiconductor on the oxide-superconductor side is free from contamination etc. and can therefore establish an electrically favorable connection with ease.

Next, the twentieth modification will be described with reference to FIG. 30. The present modification is such that the light-sensitive superconducting devices as shown in FIG. 29 are connected in series. The fabrication of the device can be readily realized by substantially the same method as in the modification of FIG. 29. Since, however, the plurality of devices are connected in series, a plurality of patterns of the photoconductive semiconductor 3 made of CdS need to be arrayed and formed.

The twenty-first modification will be described with reference to FIG. 31. The present modification has a structure in which a control electrode 7 is added to the light-sensitive superconducting device in FIG. 27. An Si single-crystal substrate is employed as the substrate 1, and the control electrode 7 is formed by the diffusion of phosphorus. The depth of the diffusion is about 300 nm. Subsequently, the front surface of the substrate 1 is oxidized at 950° C. in pure oxygen, thereby to form a gate insulator film 6. The thickness of the gate insulator film is about 60 nm. Thenceforth, a fabricating method similar to that of the modification in FIG. 27 may be employed. By applying a voltage to the control electrode 7, switching which utilizes both a light signal and a voltage signal can be realized.

Next, the twenty-second modification will be described with reference to FIG. 32. The present modification is such that the light-sensitive superconducting devices in FIG. 31 are connected in series. The fabrication of the device can be readily realized by substantially the same method as that of the modification in FIG. 31. Since, however, the plurality of devices are connected in series, the control electrodes 7 and the gate insulator film portions 6 need to be arrayed and formed. It is needless to say that, as the material of the substrate 1, Si may well be replaced with a material such as Ge, GaAs, InAs, InP, GaSb or GaP.

The twenty-third modification will be described with reference to FIG. 33. The present modification has a structure in which a control electrode 7 is added to the light-sensitive superconducting device in FIG. 29. An Si single-crystal substrate is employed as the substrate 1, and the control electrode 7 is formed by the diffusion of phosphorus. The depth of the diffusion is about 300 nm. Subsequently, the front surface of the substrate 1 is oxidized at 950° C. in pure oxygen, thereby to form a gate insulator film 6. The thickness of the gate insulator film is about 60 nm. Thenceforth, a fabricating method similar to that of the modification in FIG. 29 may be employed. By applying a voltage to the control electrode 7, switching which utilizes both a light signal and a voltage signal can be realized.

Next, the twenty-fourth modification will be described with reference to FIG. 34. The present modification is such that the light-sensitive superconducting devices as shown in FIG. 33 are connected in series. The fabrication of the device can be readily realized by substantially the same method as that of the modification in FIG. 33. Since, however, the plurality of devices are connected in series, the control electrodes 7 and the gate insulator film portions 6 need to be arrayed and formed.

Next, the twenty-fifth modification will be described with reference to FIG. 35. In the present modification, oxide-superconductor portions 2 and inter-layer insulator film portions 8 are alternately stacked, and a photoconductive semiconductor film 3 is formed on the oblique section of the stacked structure. An MgO single crystal having the (001) orientation is employed for a substrate 1. A film having a composition of $YBa_2Cu_3O_{7-\delta}$ and being about 200 nm thick is employed as the oxide-superconductor portion 2, while a film of MgO having a thickness of about 100 nm and formed by sputtering is employed as the inter-layer insulator film portion 8. The superconductor portions and the insulator film portions are stacked and formed, and are thereafter processed into the structure shown in FIG. 35 by etching with Ar ions. Lastly, the photoconductive semiconductor 3 made of CdS and having a thickness of about 300 nm is formed by evaporation. Then, the device is finished up.

In this case, the two oxide-superconductor portions 2 form a superconducting weak link portion through the photoconductive semiconductor film 3. When light is projected on the weak link portion from the side of the photoconductive semiconductor 3, a switching operation can be realized.

Next, the twenty-sixth modification will be described with reference to FIG. 36. The present modification is such that the light-sensitive superconducting device as shown in FIG. 35 are connected in series. The device can enlarge an output signal based on the projection of light. Accordingly, it has the advantage that the sensitivity of detection of the light can be enhanced. The fabrication of the device can be readily realized by substantially the same method as that of the modification in FIG. 35.

The twenty-seventh modification will be described with reference to FIG. 37. The present modification has a structure in which a control electrode 7 is added to the light-sensitive superconducting device in FIG. 35. After the superconducting device in the modification of FIG. 35 has been formed, a gate insulator film 8 made of $SiO_2$ having a thickness of about 60 nm thick and the gate electrode 7 made of an Al evaporated film having a thickness of about 300 nm are formed by sputtering. Switching which utilizes both a light signal and a voltage signal can be realized by applying a voltage to the control electrode 7.

Next, the twenty-eighth modification will be described with reference to FIG. 38. The present modification is such that the light-sensitive superconducting devices as shown in FIG. 37 are connected in parallel. The fabrication of the device can be readily realized by substantially the same method as that of the modification in FIG. 37.

The twenty-ninth modification will be described with reference to FIG. 39. On a substrate as which a photoconductive semiconductor 3 made of an Si single crystal is employed, an oxide-superconductor 2 having a composition of $YBa_2Cu_3I_{7-\delta}$ and being about 300 nm thick is formed by sputtering. Subsequently, a part of the oxide-superconductor 2 is removed by Ar-ion etching in which a photoresist is used for a mask, whereby a weak link portion 5 is formed. When the thickness of the weak link portion 5 is set at about 50 nm, light may well be projected from the upper surface of the device. However, the device is operated even by the projection of light from the lower surface of the substrate.

The thirtieth modification will be described with reference to FIG. 40. The present modification corresponds to a case where, in the modification of FIG. 39, the oxide-superconductor 2 is removed over a predetermined full width so as to be separated into two superconducting electrodes. The fabrication of the device may be similar to that of the modification in FIG. 39. The two oxide-superconductor portions 2 are coupled through the photoconductive semiconductor 3, and the coupling part forms a superconducting weak link. In the present modification, the photoconductive semiconductor itself is used as the substrate, and light can be projected from the lower surface of the substrate. Therefore, a higher density of integration is possible.

It is favorable for enhancing the sensitivity of a device that the devices shown in FIGS. 39 and 40 are connected in series with each other and are operated.

The thirty-first modification will be described with reference to FIG. 41. The present modification has a structure in which a control electrode 7 is added to the light-sensitive superconducting device in FIG. 39. An Si single-crystal substrate is employed as a substrate 1, and the control electrode 7 is formed by the diffusion of phosphorus. The depth of the diffusion is about 300 nm. Subsequently, the front surface of the substrate 1 is oxidized at 950° C. in pure oxygen so as to form a gate insulator film 6. The thickness of the gate insulator film is about 60 nm. Further, the photoconductive semiconductor layer 3 made of Si and having a thickness of about 50 nm is formed by CVD (chemical vapor deposition). Thenceforth, a fabricating method similar to that of the modification in FIG. 39 may be employed. Switching which utilizes both a light signal and a voltage signal can be realized by applying a voltage to the control electrode 7.

The thirty-second modification will be described with reference to FIG. 42. The present modification has a structure in which a control electrode 7 is added to the light-sensitive superconducting device in FIG. 40. An Si single-crystal substrate is employed as a substrate 1, and the control electrode 7 is formed by the diffusion of phosphorus. The depth of the diffusion is about 300 nm. Subsequently, the front surface of the substrate 1 is oxidized at 950° C. in pure oxygen so as to form a gate insulator film 6. The thickness of the gate insulator film is about 60 nm. Further, the photoconductive semiconductor layer 3 made of Si and having a thickness of about 50 nm is formed by chemical vapor deposition. Thenceforth, a fabricating method similar to that of the modification in FIG. 40 may be employed. Switching which utilizes both a light signal and a voltage signal can be realized by applying a voltage to the control electrode 7.

The thirty-third modification will be described with reference to FIG. 43. On an MgO single-crystal substrate 1 having the (001) orientation, an oxide-superconductor 2 whose composition is $YBa_2Cu_3O_{7-\delta}$ is formed by sputtering. The thickness of the oxide-superconductor is about 200 nm. Subsequently, a film of CdS having a thickness of about 100 nm is formed as a photoconductive semiconductor 3 by vacuum evaporation. An oxide-superconductor 2 whose composition is $YBa_2Cu_3O_{7-\delta}$ and which is about 300 nm thick is formed again. Then, a light-sensitive superconducting device can be realized. By the way, metal masks are used for all the steps of forming patterns.

Next, the thirty-fourth modification will be described with reference to FIG. 44. The present modification is such that the light-sensitive superconducting devices as shown in FIG. 43 are connected in series. The fabrication of the device can be readily realized by substantially the same method as that of the modification in FIG. 43.

Figure 45:
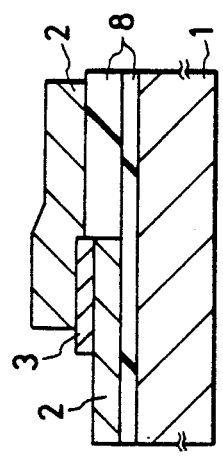

The thirty-fifth modification will be described with reference to FIG. 45. The present modification has the structure in which the photoconductive thin film 3 is held between the portions of the oxide-superconductor 2 similarly to the modification in FIG. 43, but it is characterized in that a stepped portion is formed by providing an inter-layer insulator film 8 on the substrate 1 beforehand and that the height of a stepped portion generated by the first portion of the oxide-superconductor 2 is relieved by utilizing the stepped portion of the insulator film. As the material of the inter-layer insulator film 8, any of $SiO_2$, $Si_3N_4$, MgO, etc. can be employed, but these are not restrictive. The other fabricating steps may be similar to those of the modification in FIG. 43.

Figure 46:
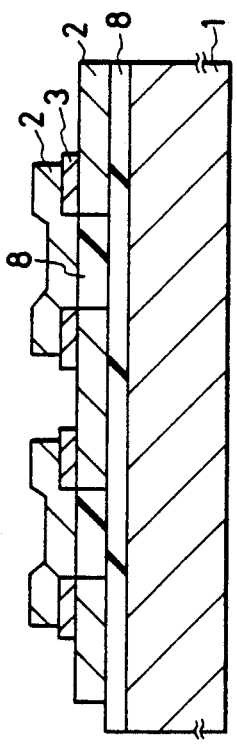

Next, the thirty-sixth modification will be described with reference to FIG. 46. The present modification is such that the light-sensitive superconducting devices as shown in FIG. 45 are connected in series. It can enlarge an output signal based on the projection of light. Accordingly, it has the advantage that the light detection sensitivity thereof can be readily realized by substantially the same method as that of the modification in FIG. 45.

Figure 47:
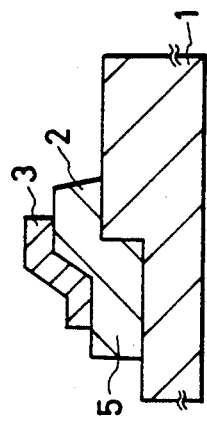

Next, the thirty-seventh modification will be described with reference to FIG. 47. At the front surface of an MgO single-crystal substrate 1 having the (001) orientation, a stepped portion whose height is about 200 nm is formed by mechanical polish. Subsequently, an oxide-superconductor 2 having a composition of $YB_2Cu_3O_{7-\delta}$ and being about 300 nm thick is formed. A weak link 5 is formed in correspondence with the stepped portion. The height of the stepped portion should desirably be similar to that in the modification of FIG. 10. Lastly, a photoconductive semiconductor 3 made of CdS and having a thickness of about 500 nm is formed by vacuum evaporation. In the above way, the superconducting device of the present invention can be realized.

Figure 48:
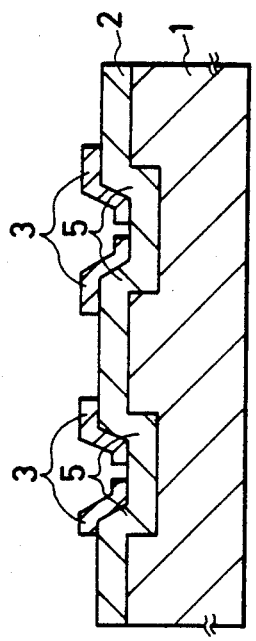

Next, the thirty-eighth modification will be described with reference to FIG. 48. The present modification is such that the light-sensitive superconducting devices as shown in FIG. 47 are connected in series. The fabrication of the device can be readily realized by substantially the same method as that of the modification in FIG. 47.

Figure 49:
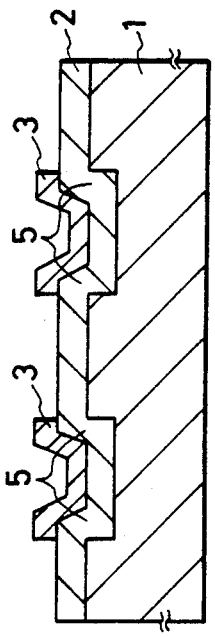

The thirty-ninth modification will be described with reference to FIG. 49. The present modification basically has the same structure as that of the device illustrated as the modification in FIG. 48, but it consists in that the photoconductive semiconductor 3 of two adjacent elements of the device is kept joined without being separated. Even with such a construction, the object of the present invention can be satisfactorily achieved. Since microfabrication is dispensed with in this way, the available percentage of the articles of the device rises, and the manufacturing process of the device can be simplified. In FIG. 49, the photoconductive semiconductor 3 may be formed so as to cover at least the weak link portions 5 which are formed in correspondence with the stepped portions of the substrate 1.

Figure 50:
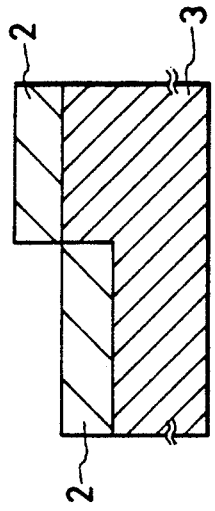

The fortieth modification will be described with reference to FIG. 50. On a substrate 1 which is made of an MgO single crystal having the (001) orientation, a photoconductive semiconductor 3 made of CdS and having a thickness of 300 nm is formed by vacuum evaporation.

Subsequently, an oxide-superconductor 2 having a composition of YBa$_2$Cu$_3$O$_{7-\delta}$ and being about 400 nm thick is formed by sputtering with Ar gas. In this case, the thickness of the film of the photoconductive semiconductor 3 should desirably have a value similar to the height of the stepped portion in the modification of FIG. 10, and also the thickness of the film of the oxide-superconductor 2 is selected according to the same criterion. Thus, a weak link 5 can be formed at the stepped part of the oxide-superconductor. It is needless to say that, as the material of the substrate 1, MgO may be replaced with the same material as the photoconductive semiconductor 3, and that the substrate 1 and the photoconductive semiconductor may be formed as being unitary.

Figure 51:
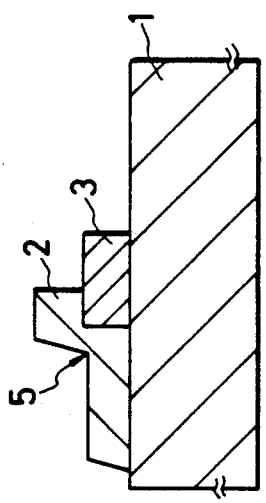

Next, the forty-first modification will be described with reference to FIG. 51. The present modification is such that the light-sensitive superconducting devices as shown in FIG. 50 are connected in series. It can enlarge an output signal based on the projection of light. Accordingly, it has the advantage that the light detection sensitivity of the device can be enhanced. The fabrication of the device can be readily realized by substantially the same method as that of the modification in FIG. 50.

Figure 52:
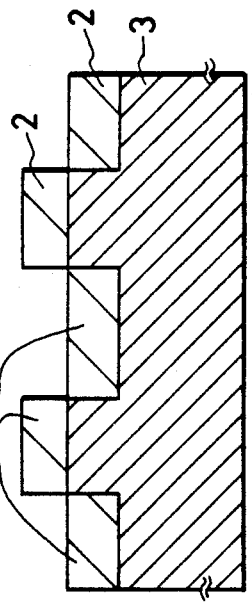

The forty-second modification will be described with reference to FIG. 52. A part of a photoconductive semiconductor 3 made of an Si single crystal is removed by reactive ion etching, thereby to form a stepped portion having a height of about 200 nm. The height of the stepped portion should desirably be substantially equal to or less than the thickness of an oxide-superconductor 2 which is to be subsequently formed, but the device is usable even when the height lies within a range of about $\frac{1}{2}$-$\frac{1}{3}$ of the thickness. As the oxide-superconductor 2, YBa$_2$Cu$_3$O$_{7-\delta}$ is formed to a thickness of about 190 nm by sputtering. In the above way, the device of the present invention can be formed. The present modification is characterized by spacing two superconducting electrodes by means of the stepped portion, and utilizing a superconducting weak link in which the two superconductor portions are coupled through the photoconductive semiconductor.

Figure 53:
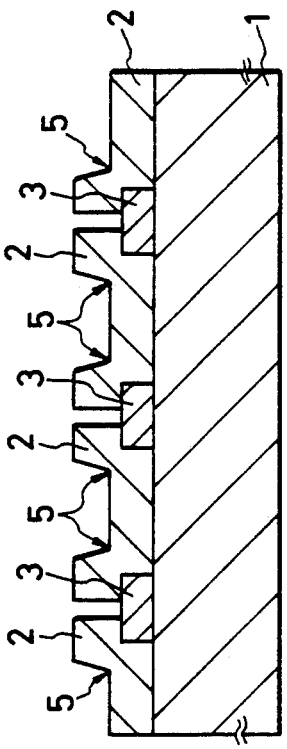

Next, the forty-third modification will be described with reference to FIG. 53. The present modification is such that the light-sensitive superconducting devices as shown in FIG. 52 are connected in series. The fabrication of the device can be readily realized by substantially the same method as that of the modification in FIG. 52. Since, however, the plurality of devices are connected in series, a plurality of stepped portions need to be formed.

The forty-fourth modification will be described with reference to FIG. 54. A part of a substrate 1 made of an Si single crystal is removed by mechanical polish, thereby to form a stepped portion having a height of about 200 nm. The height of the stepped portion should desirably be substantially equal to or less than the thickness of an oxide-superconductor 2 which is to be subsequently formed, but the device is usable even when the height lies within a range of about $\frac{1}{2}$-$\frac{1}{3}$ of the thickness. As the oxide-superconductor 2, YBa$_2$Cu$_3$O$_{7-\delta}$ is formed to a thickness of about 190 nm by sputtering. Lastly, an evaporated film made of CdS and having a thickness of about 400 nm is formed as a photoconductive semiconductor 3. In the above way, the device of the present invention can be formed. The present modification is characterized by spacing two superconducting electrodes by means of the stepped portion, and utilizing a superconducting weak link in which the two superconductor portions are coupled through the photoconductive semiconductor. In the present modification, the material of a photoconductive semiconductor may well be used as the substrate 1. In this case, light can be projected from both the upper and lower surfaces of the device.

Next, the forth forty-fifth modification will be described with reference to FIG. 55. The present modification is such that the light-sensitive superconducting devices as shown in FIG. 54 are connected in series. The fabrication of the device can be readily realized by substantially the same method as that of the modification in FIG. 54. Since, however, the plurality of devices are connected in series, a plurality of stepped portions need to be formed.

The forty-sixth modifications will be described with reference to FIG. 56. The present modification has a structure in which a control electrode 7 is added to the light-sensitive superconducting device in FIG. 52. An Si-single-crystal substrate is employed as a substrate 1, and the control electrode 7 is formed by the diffusion of phosphorus. The depth of the diffusion is about 300 nm. Subsequently, the front surface of the substrate 1 is oxidized at 950° C. in pure oxygen so as to form a gate insulator film 6. The thickness of the gate insulator film is about 60 nm. Thenceforth, a fabricating method similar to that of the modification in FIG. 52 may be employed. Switching which utilizes both a light signal and a voltage signal can be realized by applying a voltage to the control electrode 7.

Next, the forty-seventh modification will be described with reference to FIG. 57. The present modification is such that the light-sensitive superconducting devices as shown in FIG. 56 are connected in series. The fabrication of the device can be readily realized by substantially the same method as that of the modification in FIG. 56.

Figure 58:
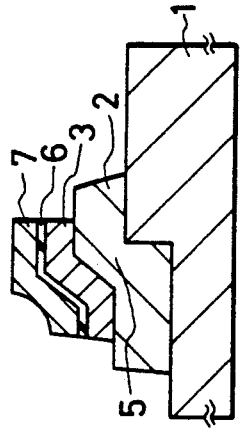

The forty-eighth modification will be described with reference to FIG. 58. The present modification has a structure in which a control electrode 7 is added to the light-sensitive superconducting device in FIG. 50. An Si single-crystal substrate is employed as the substrate 1, and the control electrode 7 is formed by the diffusion of phosphorus. The depth of the diffusion is about 300 nm. Subsequently, the front surface of the substrate 1 is oxidized at 950° C. in pure oxygen so as to form a gate insulator film 6. The thickness of the gate insulator film is about 60 nm. Thenceforth, a fabricating method similar to that of the modification in FIG. 50 may be employed. Switching which utilizes both a light signal and a voltage signal can be realized by applying a voltage to the control electrode 7. It is needless to say that the device may well be constructed using the same material for the substrate 1 and the photoconductive semiconductor 3.

Figure 59:
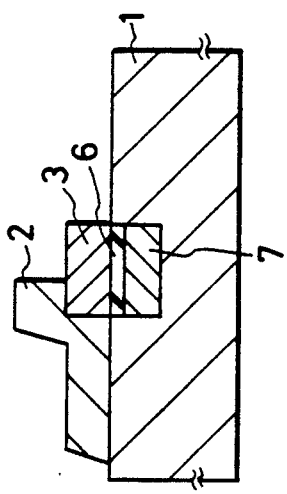

Next, the forty-ninth modification will be described with reference to FIG. 59. The present modification is such that the light-sensitive superconducting devices as shown in FIG. 58 are connected in series. The fabrication of the device can be readily realized by substantially the same method as that of the modification in FIG. 58.

Figure 60:
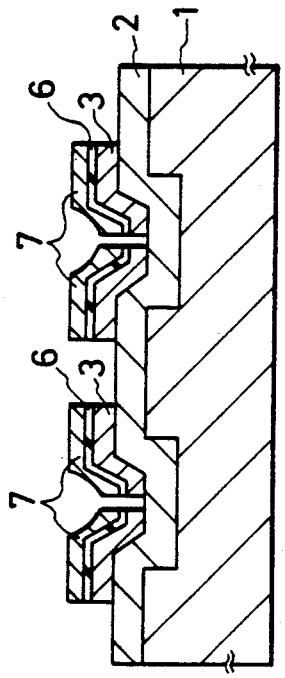

The fiftieth modification will be described with reference to FIG. 60. The present modification has a structure in which a control electrode 7 is added to the light-sensitive superconducting device in FIG. 47.

Figure 61:
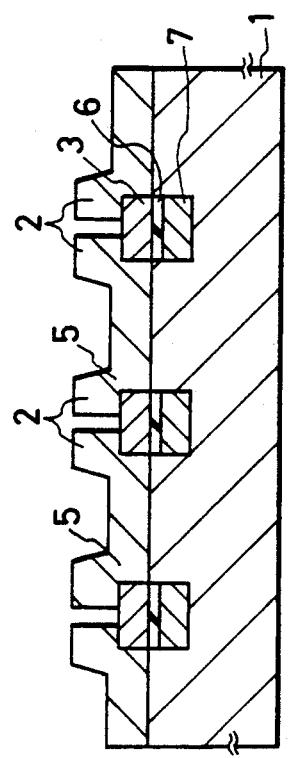

Next, the fifty-first modification will be described with reference to FIG. 61. The present modification is such that the light-sensitive superconducting devices as shown in FIG. 60 are connected in series.

Figure 62:
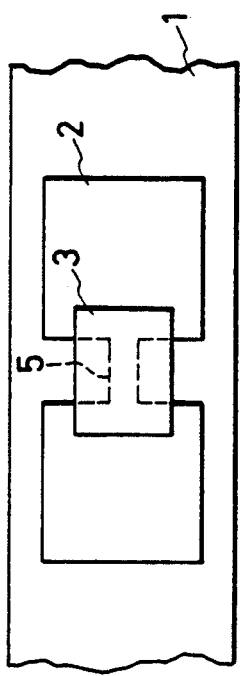

The fifty-second modification will be described with reference to FIG. 62. Here, the film of an oxide-superconductor 2 is narrowed to form a superconducting weak link. The oxide-superconductor 2 is about 300 nm thick, and is made of $YBa_2Cu_3O_{7-\delta}$. It is formed by sputtering on a substrate 1 made of sapphire. By processing the oxide-superconductor with an Ar ion beam, the weak link portion 5 is set at a width of 1 $\mu$m and a thickness of about 1 $\mu$m. The length of the weak link portion should desirably be a still less value, about 0.1 $\mu$m–about 2.0 $\mu$m, but it may of course be still greater. The width is recommended to be about 0.5–2 $\mu$m, but it may well be any other value. On the part of the oxide-superconductor including the weak link portion 5, a CdS film having a thickness of about 300 nm is evaporated as a photoconductive semiconductor 3. In the above way, the device of the present invention can be realized. When the technique of narrowing the superconductor 2 as illustrated in FIG. 62 is conjointly applied to the weak link portion of each of the modifications shown in FIGS. 11–61, device characteristics can be controlled with ease.

Figure 63:
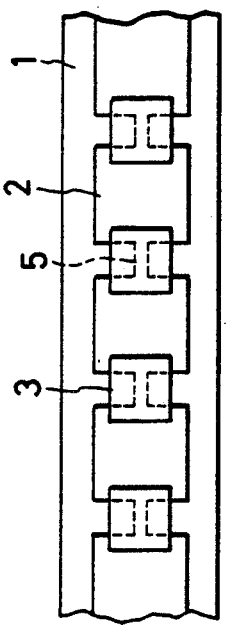

Next, the fifty-third modification will be described with reference to FIG. 63. The present modification is such that the light-sensitive superconducting devices as shown in FIG. 62 are connected in series.

The fifty-fourth modification will be described with reference to FIG. 64. The present modification consists in that the photoconductive semiconductor 3 disposed over the oxide-superconductor 2 in the modification of FIG. 62 is provided under the oxide-superconductor. The device can be fabricated substantially similarly to the modification in FIG. 62. The modifications in FIG. 62 and FIG. 64 have the device structures flattened, and therefore have the advantage that the processing is easy, so the available percentage of the articles of each device can be raised.

Figure 64:
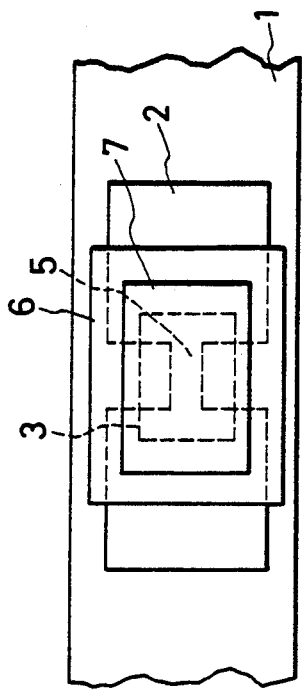
Figure 65:
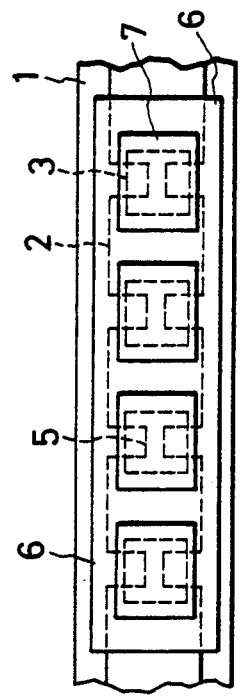

The fifty-fifth modification in FIG. 65 is such that the light-sensitive superconducting devices as shown in FIG. 64 are connected in series.

It is to be understood that both the end electrodes of an assembly in which two or more of the devices in the various modifications described above are connected in series may be joined to construct a superconducting quantum interference device, which can be switched by the projection of light. In this case, if the number of the series devices is two, the assembly actually fulfills the same function as that of the parallel arrangement of the two devices. Using a plurality of such assemblies, the parallel arrangement of four or more devices can be readily constructed.

In the modifications stated above, a material such as $(La_{1-x}Sr_x)_2CuO_4$ or $YBa_2Cu_3O_{7-\delta}$ can be used as the material of the oxide-superconductor 2. It is needless to say that Sr may well be replaced with Ba or Ca, while Y may well be replaced with one or more elements elected from the group consisting of Sc, La, Ce, Pr, Nd, Pm, Sm, Eu, Gd, Tb, Dy, Ho, Er, Tm, Yb, Lu, Bi and Tl. It is also possible to use a material in which fluorine is added to the aforementioned material, or a material in which the oxygen of the aforementioned material is partly or wholly substituted by fluorine.

The substrate 1 or subbing material should desirably be any of $ZrO_2$, $MgO$, $Al_2O_3$, $SrTiO_3$, yttrium stabilized zirconium or zirconia, etc., but it may well be a material such as $SiO_2$, Si, garnet or sapphire.

It is needless to say that, as the photoconductive semiconductor 3, a material such as Si, InSb, Ge, GaAs, InAs, InP, GaSb, GaP, PbS or PbTe may well be employed instead of CdS.

As described above, according to the modifications, in a light-sensitive device which employs a superconductor, the detection sensivity of the device for light can be heightened in a wider range of wavelengths. As a result, the modifications bring forth the advantages that a laser, a light emitting diode or the like in the field of conventional semiconductor technology can be used as a light source, and that the device can be functionally enhanced.

[Embodiment 5]

Now, the fifth embodiment of the present invention will be described in detail. First, the fifth embodiment of the present invention will be elucidated with reference to FIG. 66. On a single-crystal substrate 1 made of MgO, an oxide having a composition of $(La_{0.9}Sr_{0.1})$ or $YBa_2Cu_3O_{7-\delta}$ and being about 1 $\mu$m thick is deposited by sputtering. The oxide is annealed at 900° C. in oxygen for about 3 hours, thereby to form an oxide-superconductor material having a crystalline structure of the perovskite type. A part of the oxide-superconductor material is heated in vacuum by a laser beam, thereby to form a semiconductor portion 3 having a large number of oxygen defects and superconducting electrodes 2a and 2b. In the above way, the light-sensitive superconducting device of the present invention can be realized.

When a laser beam having a wavelength of about 1.3 $\mu$m was projected on the semiconductor portion 3 of an example of the light-sensitive superconducting device, the value of a superconducting current flowing across the superconducting electrodes 2a and 2b changed, and the presence or intensity of the incident light could be detected. The spacing between the two superconducting electrodes 2a and 2b should desirably be selected at about 1–100 nm. Even with a greater spacing, however, the value of a normal-conducting current flowing across the superconducting electrodes 2a and 2b is changed by light or an electromagnetic wave, and hence, the device can of course be used for the detection of the presence or intensity thereof. In the device, the coefficients of thermal expansion of the materials of the semiconductor portion 3 and the superconducting electrodes 2a, 2b are substantially equal. Therefore, the example was free from the degradations of the characteristics of the device attributed to a thermal cycle and a thermal shock arising in the operation of cooling the device, etc., and the operation thereof was stable.

Figure 66:
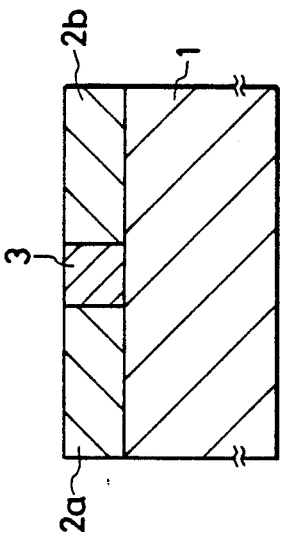
FIG. 66 is a sectional view showing a part of a light-sensitive superconducting device according to the fifth embodiment of the present invention.
Figure 67:
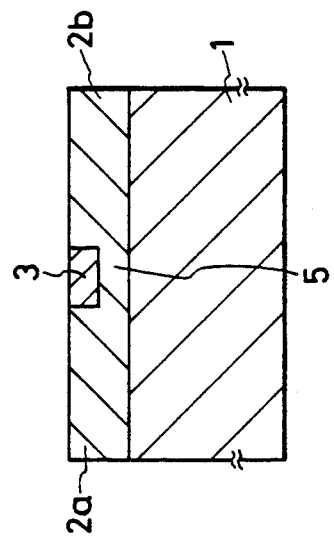

Next, a modification to the fifth embodiment of the present invention will be described with reference to FIG. 67. The materials and construction of the device are substantially the same as those of the embodiment in FIG. 66. In the present modification, however, the semiconductor portion 3 does not reach the substrate 1, but a weak link portion 5 made of the oxide-superconductor is left under the semiconductor portion 3. Such a structure can be readily realized by a measure in which, at the step of forming the semiconductor portion 3, the energy of the laser beam is adjusted to make smaller a region where the oxygen defects appear. In the present modification, quasiparticles created by light or an electromagnetic wave entering the semiconductor portion 3 change the value of a superconducting current which flows through the weak link portion 5.

Figure 68:
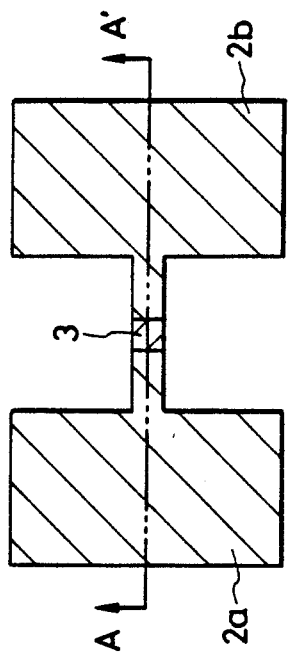
FIGS. 67 thru 70 are views each showing a modification of the light-sensitive superconducting device in FIG. 66.

In the above two examples, the features concerning the vertical sectional structures of the devices have been chiefly described. A planar structure will be described with reference to FIG. 68. The structure of a vertical section taken along line A—A' in FIG. 68 may well be the same as the structure of the example of the present invention in FIG. 66 or FIG. 67. In the present modification, parts of superconducting electrodes 2a and 2b are narrowed. Thus, a region which functions as a superconducting weak link when irradiated with light or an electromagnetic wave can be limited. Another advantage is that, since the diffusion of quasiparticles is easy even after stopping the irradiation with the light or the electromagnetic wave, the operation of the device becomes faster. Although FIG. 68 shows the example in which the superconducting electrodes 2a and 2b are partly narrowed, it is needless to say that quite the same effects are achieved even in case of narrowing a part or the whole of the semiconductor portion 3 or the weak link portion 5.

Figure 69:
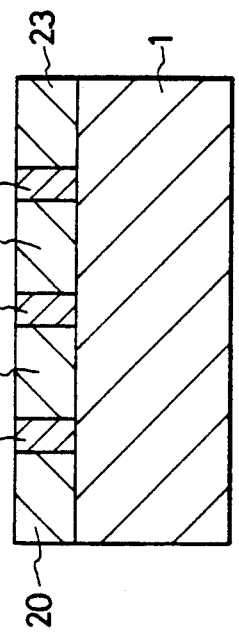

Another modification to the fifth embodiment of the present invention will be described with reference to FIG. 69. The present modification is such that the light-sensitive superconducting devices as shown in FIG. 66 or FIG. 68 are connected in series, thereby to enlarge an output in the case of the projection of the light or the electromagnetic wave. This brings forth the advantage that the efficiency of the detection can be raised.

Figure 70:
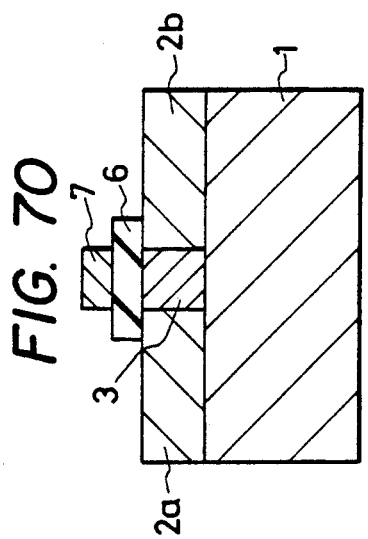

Another modification to the fifth embodiment of the present invention will be described with reference to FIG. 70. The present modification has a structure in which, on the front surface of a device having the same structure as that of the embodiment in FIG. 66, an insulator film 6 and a control electrode 7 are provided so as to cover, at least, the front surface of the semiconductor portion 3. With the device illustrated in the present modification, the operation thereof can be controlled, not only by the incidence of light or an electromagnetic wave, but also by an electric field effect based on a voltage applied to the control electrode 7.

As described above, according to the present embodiment, in an electromagnetic wave-sensitive device which employs a superconductor and a semiconductor, the degradations of the superconductor material and the semiconductor material attributed to a thermal cycle or shock can be prevented. Therefore, the embodiment has the effect that a light-sensitive superconducting device whose characteristics vary little with time and whose operation is stable can be realized.

In the foregoing embodiments, $(La_{0.9}Sr_{0.1})_2CuO_4$ or $YBa_2Cu_3O_{7-\delta}$ was employed as the superconducting material. In this material, Y may well be substituted by any of La, Yb, Lu, Tm, Dy, Sc, Ce, Pr, Nd, Sm, Eu, Gd, Tb, Ho, Er, Bi, Tl etc., and similar effects can be attained. Such examples are listed in Table 1:

TABLE 1

| Semiconductor (Normal-conductor) | | Superconductor | |
| --- | --- | --- | --- |
| $EuBa_2Cu_3O_{7-y}$ | $y > 0.5$ | $EuBa_2Cu_3O_{7-y}$ | $0 < y < 0.5$ |
| $EuSr_2Cu_3O_{7-y}$ | $y > 0.5$ | $EuSr_2Cu_3O_{7-y}$ | $0 < y < 0.5$ |
| $HoBa_2Cu_3O_{7-y}$ | $y > 0.5$ | $HoBa_2Cu_3O_{7-y}$ | $0 < y < 0.5$ |
| $HoSr_2Cu_3O_{7-y}$ | $y > 0.5$ | $HoSr_2Cu_3O_{7-y}$ | $0 < y < 0.5$ |
| $GdBa_2Cu_3O_{7-y}$ | $y > 0.5$ | $GdBa_2Cu_3O_{7-y}$ | $0 < y < 0.5$ |
| $GdSr_2Cu_3O_{7-y}$ | $y > 0.5$ | $GdSr_2Cu_3O_{7-y}$ | $0 < y < 0.5$ |
| $YbBa_2Cu_3O_{7-y}$ | $y > 0.5$ | $YbBa_2Cu_3O_{7-y}$ | $0 < y < 0.5$ |
| $YbSr_2Cu_3O_{7-y}$ | $y > 0.5$ | $YbSr_2Cu_3O_{7-y}$ | $0 < y < 0.5$ |
| $TbBa_2Cu_3O_{7-y}$ | $y > 0.5$ | $TbBa_2Cu_3O_{7-y}$ | $0 < y < 0.5$ |
| $TbSr_2Cu_3O_{7-y}$ | $y > 0.5$ | $TbSr_2Cu_3O_{7-y}$ | $0 < y < 0.5$ |
| $NdCa_2Cu_3O_{7-y}$ | $y > 0.5$ | $NdCa_2Cu_3O_{7-y}$ | $0 < y < 0.5$ |
| $NdSr_2Cu_3O_{7-y}$ | $y > 0.5$ | $NdSr_2Cu_3O_{7-y}$ | $0 < y < 0.5$ |
| $SmBa_2Cu_3O_{7-y}$ | $y > 0.5$ | $SmBa_2Cu_3O_{7-y}$ | $0 < y < 0.5$ |
| $SmSr_2Cu_3O_{7-y}$ | $y > 0.5$ | $SmSr_2Cu_3O_{7-y}$ | $0 < y < 0.5$ |
| $Ba_{2x}La_{2(1-x)}CuO_{4(1-y)}$ | $x > 0.05$ | $Ba_{2x}La_{2(1-x)}CuO_{4(1-y)}$ | $x = 0.05$ |
| $Sr_{2x}La_{2(1-x)}CuO_{4(1-y)}$ | $x > 0.05$ | $Sr_{2x}La_{2(1-x)}CuO_{4(1-y)}$ | $x = 0.05$ |
| $Ca_{2x}La_{2(1-x)}CuO_{4(1-y)}$ | $x > 0.05$ | $Ca_{2x}La_{2(1-x)}CuO_{4(1-y)}$ | $x = 0.05$ |
| $Ba_{2x}Y_{2(1-x)}CuO_{4(1-y)}$ | $x > 0.05$ | $Ba_{2x}Y_{2(1-x)}CuO_{4(1-y)}$ | $x = 0.05$ |
| $Sr_{2x}Y_{2(1-x)}CuO_{4(1-y)}$ | $x > 0.05$ | $Sr_{2x}Y_{2(1-x)}CuO_{4(1-y)}$ | $x = 0.05$ |
| $Ba_{2x}Eu_{2(1-x)}CuO_{4(1-y)}$ | $x > 0.05$ | $Ba_{2x}Eu_{2(1-x)}CuO_{4(1-y)}$ | $x = 0.05$ |
| $Sr_{2x}Eu_{2(1-x)}CuO_{4(1-y)}$ | $x > 0.05$ | $Sr_{2x}Eu_{2(1-x)}CuO_{4(1-y)}$ | $x = 0.05$ |
| $Ba_{2x}Eu_{2(1-x)}CuO_{4(1-y)}$ | $x > 0.05$ | $Ba_{2x}Eu_{2(1-x)}CuO_{4(1-y)}$ | $x = 0.05$ |

What is claimed is:

1. A superconducting photodetector comprising:
a substrate;
an oxide-superconductor film which is formed on said substrate, and which has at least one superconducting weak link portion;
a photoconductive semiconductor which is formed on said oxide-superconductor film so as to cover at least a part of said superconducting weak link portion; and
means for irradiating said photoconductive semiconductor with either light or an electromagnetic wave and thus controlling superconducting current to flow within said oxide-superconductor film.

2. A superconducting photodetector according to claim 1, wherein said superconducting weak link portion is formed by providing said oxide-superconductor film on a stepped portion of said substrate.

3. A superconducting photodetector according to claim 1, wherein said superconducting weak link portion is formed by providing said oxide-superconductor film in a groove which is formed in said substrate.

4. A superconducting photodetector according to claim 1, wherein said superconducting weak link portion is formed by forming a groove in a part of said oxide-superconductor film so as to make said part thinner than the other part.

5. A superconducting photodetector according to claim 4, wherein said superconducting weak link portion has a thickness which is $\frac{1}{4}-1/10$ of a thickness of said other part.

6. A superconducting photodetector according to claim 1, wherein said superconducting weak link portion is formed by providing said oxide-superconductor film so as to become flat on a protrusion with which said substrate is provided.

7. A superconducting photodetector according to claim 1, wherein said oxide-superconductor film has two portions spaced from each other, and wherein said superconducting weak link portion is formed through said photoconductive semiconductor which is provided so as to lie in contact with both portions of said oxide-superconductor film said both portions being spacedly formed so as to hold therebetween a protrusion with which said substrate is provided.

8. A superconducting photodetector according to claim 2, wherein said oxide-superconductor film is narrower in said superconducting weak link portion than in the other part.

9. A superconducting photodetector according to claim 1, further comprising a control electrode which subjects said photoconductive semiconductor to a fixed amount of carrier change and which is provided on said photoconductive semiconductor.

10. A superconducting photodetector according to claim 1, wherein said superconducting weak link portion is formed by alternately stacking portions of said oxide-superconductor film and portions of an interlayer insulator film, and said photoconductive semiconductor in the form of a film is provided so as to cover a section of the stacked structure.

11. A superconducting photodetector according to claim 10, further comprising a control electrode which subjects said photoconductive semiconductor to a fixed amount of carrier change and which is provided on said photoconductive semiconductor.

12. A superconducting photodetector according to claim 1, wherein said superconducting weak link portion is formed by stacking portions of said oxide-superconductor film with said photoconductive semiconductor interposed therebetween.

13. A superconducting photodetector according to claim 1, wherein said oxide-superconductor film is made of an oxide of either of perovskite type or $K_2NiF_1$ type crystalline structures, containing at least one element selected from the group consisting of Ba, Sr, Ca, Mg, and Ra; at least one element selected from the group consisting of La, Y, Ce, Sc, Sm, Eu, Er, Gd, Ho, Yb, Nd, Pr, Lu, Tb, Bi and Tl; Cu; and O.

14. A superconducting photodetector according to claim 1, wherein said superconducting weak link portion is formed by making said oxide-superconductor film narrower in this portion than in the other part.

15. A superconducting photodetector according to claim 1, wherein the photoconductive semiconductor has a band gap of 0.01-1.5 eV.

16. A superconducting photodetector according to claim 1, wherein the photoconductive semiconductor is made of a material selected from the group consisting of CdS, Si, InSb, Ge, GaAs, PbS, CdTe and PbTe.

17. A superconducting photodetector according to claim 1, wherein each superconducting weak link portion, with oxide-superconductor film portions at each side thereof and with a photoconductive semiconductor thereon, forms a superconducting element, the photodetector including a plurality of superconducting elements, each having said superconducting weak link portion with oxide-superconductor film portions at each side thereof and with a photoconductive semiconductor thereon, the plurality of superconducting elements being connected in series.

18. A superconducting photodetector comprising:
a substrate which is made of a photoconductive semiconductor;
an oxide-superconductor film which is formed on said substrate, and which has at least one superconducting weak link portion; and
means for irradiating said superconducting weak link portion with either light or an electromagnetic wave and thus controlling superconducting current to flow within said oxide-superconductor film.

19. A superconducting photodetector according to claim 18, wherein said superconducting weak link portion is formed by providing said oxide-superconductor film so as to become flat on a protrusion with which said substrate is provided.

20. A superconducting photodetector according to claim 18, further comprising a control electrode which subjects said photoconductive semiconductor to a fixed amount of carrier change and which is provided on a side of said photoconductive semiconductor remote from said oxide-superconductor film.

21. A superconducting photodetector according to claim 19, further comprising a control electrode which subjects said photoconductive semiconductor to a fixed amount of carrier change and which is provided on a protrusion of said photoconductive semiconductor.

22. A superconducting photodetector according to claim 18, wherein said superconducting weak link portion is formed by forming a groove in a part of said oxide-superconductor film so as to make said part thinner than the other part.

23. A superconducting photodetector according to claim 22, wherein said superconducting weak link portion has a thickness which is $\frac{1}{4}-1/10$ of a thickness of said other part.

24. A superconducting photodetector according to claim 18, wherein said superconducting weak link portion is formed by providing portions of said oxide-superconductor film at a spacing which is not greater than 10 times a coherence length in said photoconductive semiconductor.

25. A superconducting photodetector according to claim 18, wherein said superconducting weak link portion is formed by providing said oxide-superconductor film on a stepped portion of said substrate.

26. A superconducting photodetector according to claim 18, wherein said oxide-superconductor film is made of an oxide of either of perovskite type $K_2NiF_4$ type crystalline structures, containing at least one element selected from the group consisting of Ba, Sr, Ca, Mg, and Ra; at least one element selected from the group consisting of La, Y, Ce, Sc, Sm, Eu, Er, Gd, Ho, Yb, Nd, Pr, Lu, Tb, Bi and Tl; Cu; and O.

27. A superconducting photodetector according to claim 18, wherein said superconducting weak link portion is formed by making said oxide-superconductor film narrower in this portion than in the other part.

28. A superconducting photodetector according to claim 18, wherein the oxide-superconductor film has a plurality of superconducting weak link portions, so as to form a plurality of superconducting elements each having a superconducting weak link portion, the superconducting elements being connected in series.

29. A superconducting photodetector comprising:
a substrate;
a photoconductive semiconductor film which is provided on a part of said substrate, and an end part of which is in a stepped shape; and an oxide-superconductor film which is provided so as to cover at least a part of said end part of said photoconductive semiconductor film, and which is thinner in a part corresponding to said end part, than in the other part so as to form a superconducting weak link portion at said part corresponding to said end part.

30. A superconducting photodetector according to claim 29, further comprising a control electrode which subjects said photoconductive semiconductor film to a fixed amount of carrier change and which is provided on a side of said photoconductive semiconductor film remote from said oxide-superconductor film.

31. A superconducting photodetector according to claim 29, wherein a height of the stepped end part is about 1-5 times a thickness of said oxide-superconductor film.

32. A superconducting photodetector according to claim 29, wherein said oxide-superconductor film is made of an oxide of either of perovskite type or $K_2NiF_4$ type crystalline structures, containing at least one element selected from the group consisting of Ba, Sr, Ca, Mg, and Ra; at least one element selected from the group consisting of La, Y, Ce, Sc, Sm, Eu, Er, Gd, Ho, Yb, Nd, Pr, Lu, Tb, Bi and Tl; Cu; and O.

33. A superconducting photodetector comprising:
a substrate;
an oxide-superconductor film which is provided on said substrate, or which has at least one superconducting weak link portion;
a semiconductor which is provided in said oxide-superconductor film, and which is made of an oxide material having the same composition as that of a constituent material of said oxide-superconductor film; and
means for irradiating said semiconductor with either of light and an electromagnetic wave and thus controlling superconducting current to flow within said oxide-superconductor film.

34. A superconducting photodetector according to claim 33, wherein said superconducting weak link portion is formed by dividing said oxide-superconductor film by means of said semiconductor.

35. A superconducting photodetector according to claim 33, wherein said superconducting weak link portion is formed by making a part of said oxide-superconductor film thinner than the other part thereof by means of said semiconductor.

36. A superconducting photodetector according to claim 33, wherein said oxide-superconductor film is narrower in said superconducting weak link portion than the other part.

37. A superconducting photodetector according to claim 33, further comprising a control electrode which subjects said semiconductor to a fixed amount of carrier change and which is provided so as to cover said semiconductor.

38. A superconducting photodetector according to claim 33, wherein said oxide-superconductor film is made of an oxide of either of perovskite type or $K_2NiF_4$ type crystalline structures, containing at least one element selected from the group consisting of Ba, Sr, Ca, Mg, and Ra; at least one element selected from the group consisting of La, Y, Ce, Sc, Sm, Eu, Er, Gd, Ho, Yb, Nd, Pr, Lu, Tb, Bi and Tl; Cu; and O.

39. A superconducting device comprising:
a substrate which has a stepped portion;
a first superconducting electrode and a second superconducting electrode, each formed on said substrate on a part thereof other than the stepped portion; and
a superconducting film coupling the first superconducting electrode and the second superconducting electrode, the superconducting film being formed on the substrate including at the stepped portion, the superconducting film being sufficiently thin at the stepped portion so as to form a superconducting weak link at the stepped portion.

40. A superconducting device according to claim 39, wherein a height of said stepped portion is about 1-5 times as great as a thickness of said oxide-superconductor film.

41. A superconducting device according to claim 39, wherein said oxide-superconductor film is made of an oxide of either of perovskite type and $K_2NiF_4$ type crystalline structures, containing at least one element selected from the group consisting of Ba, Sr, Ca, Mg, and Ra; at least one element selected from the group consisting of La, Y, Ce, Sc, Sm, Eu, Er, Gd, Ho, Yb, Nd, Pr, Lu, Tb, Bi and Tl; Cu; and O.

42. A superconducting device according to claim 38, wherein the superconducting film is an oxide-superconductor film.

43. A superconducting device according to claim 39, wherein said first and second superconducting electrodes and said superconducting film are provided as an integral single film.

44. A superconducting device according to claim 39, wherein the first superconducting electrode and the second superconducting electrode are each provided on the substrate spaced from each other, with the stepped portion therebetween, and wherein the superconducting film bridges the space between the first and second superconducting electrodes, on the substrate.

45. A superconducting device according to claim 39, wherein the substrate is made of an insulating material.

46. A superconducting device according to claim 39, wherein said weak link portion is provided only along said stepped portion.

47. A superconducting device according to claim 39, wherein the first and second superconducting electrodes and the superconducting film are all made of a same superconducting material.

48. A superconducting device according to claim 47, wherein said same superconducting material is an oxide superconductor.

49. A superconducting photodetector comprising:
a substrate having a main surface;
at least one first superconducting electrode and at least one second superconducting electrode, each provided overlying the main surface of the substrate and spaced from each other, a first and second superconducting electrode forming a pair of superconducting electrodes; and
a photoconducting semiconductor providing a coupling part to couple each pair of first and second superconducting electrodes, the coupling part provided by the photoconductive semiconductor forming a superconducting weak link between the pair of first and second superconducting electrodes.

50. A superconducting photodetector according to claim 49, wherein each of the first and second superconducting electrodes are provided on the main surface of the substrate and spaced from each other in a direction along the main surface of the substrate, the photoconductive semiconductor bridging the space between the first and second superconducting electrodes.

51. A superconducting photodetector according to claim 49, wherein each pair of first and second superconducting electrodes, and the photoconductive semiconductor therebetween, form a superconducting element; and wherein the photodetector includes a plurality of pairs of first and second superconducting electrodes so as to provide a plurality of superconducting elements, the plurality of superconducting elements being connected in series.

52. A superconducting photodetector according to claim 49, wherein, for each pair of adjacent first and second superconducting electrodes, one of the pair is provided on the substrate and the other of the pair is provided spaced from the substrate, with the photoconductive semiconductor provided between the adjacent first and second superconducting electrodes.

* * * * *